(12) United States Patent
Fukutomi et al.

(45) Date of Patent: May 17, 2005
(10) Patent No.: US 6,893,171 B2

(54) SUBSTRATE TREATING APPARATUS

(75) Inventors: Yoshiteru Fukutomi, Kyoto (JP);
Kenji Sugimoto, Kyoto (JP); Takashi Ito, Kyoto (JP); Takeo Okamoto, Kyoto (JP); Yukihiko Inagaki, Kyoto (JP); Katsushi Yoshioka, Kyoto (JP); Tsuyoshi Mitsuhashi, Kyoto (JP)

(73) Assignee: Dainippon Screen Mfg. Co., Ltd. (JP)

( * ) Notice: Subject to any disclaimer, the term of this patent is extended or adjusted under 35 U.S.C. 154(b) by 109 days.

(21) Appl. No.: 10/417,460

(22) Filed: Apr. 16, 2003

(65) Prior Publication Data

US 2003/0213431 A1 Nov. 20, 2003

(30) Foreign Application Priority Data

May 1, 2002 (JP) ........................... 2002-129817

(51) Int. Cl.[7] ............ G03D 5/00; G03B 27/32; B65H 1/00; B65G 49/07
(52) U.S. Cl. ............ 396/611; 414/225.1; 414/935; 355/27
(58) Field of Search ............ 414/225.1, 225, 414/935, 940; 396/611; 118/500, 503; 355/27

(56) References Cited

U.S. PATENT DOCUMENTS 5,651,823 A * 7/1997 Parodi et al. ............ 118/500

6,515,731 B1 * 2/2003 Akimoto ............ 355/27

FOREIGN PATENT DOCUMENTS

| JP | 04-305914 | 10/1992 |
|---|---|---|
| JP | 07-171478 | 7/1995 |

OTHER PUBLICATIONS

Translation of Japanese Patent 07–171478.*

* cited by examiner

Primary Examiner—Alan Mathews
(74) Attorney, Agent, or Firm—Ostrolenk, Faber, Gerb & Soffen, LLP

(57) ABSTRACT

A substrate treating apparatus disclosed herein realizes improved throughput. The substrate treating apparatus according to this invention includes an antireflection film forming block, a resist film forming block and a developing block arranged in juxtaposition. Each block includes chemical treating modules, heat-treating modules and a single main transport mechanism. The main transport mechanism transports substrates within each block. Transfer of the substrates between adjacent blocks is carried out through substrate rests. The main transport mechanism of each block is not affected by movement of the main transport mechanisms of the adjoining blocks. Consequently, the substrates may be transported efficiently to improve the throughput of the substrate treating apparatus.

22 Claims, 11 Drawing Sheets

Fig.11

| transport steps | 1st main transport mech. | transport steps | 2nd main transport mech. | transport steps | 3rd main transport mech. | transport steps | 4th main transport mech. |
|---|---|---|---|---|---|---|---|
| 1+α | PASS1 PASS2 | 1+α | PASS3 PASS4 | 1+α | PASS5 PASS6 | 1+α | PASS7 PASS8 |
| 2 | → CP | 2 | → CP | 2+α | → PASS7 PASS8 | 2 | → EEW |
| 3 | → BARC | 3 | → PR | 3 | → CP | 3 | → CP |
| 4 | → HP | 4 | → PHP | 4 | → SD | 4+α | → PASS9 PASS10 |
| 5 | → WCP | 5 | → CP | 5 | → HP | 5 | → PEB |
| 6+α | → PASS3 PASS4 | 6+α | → PASS5 PASS6 | 6 | → WCP | | |

SUBSTRATE TREATING APPARATUS

BACKGROUND OF THE INVENTION (1) Field of the Invention

This invention relates to a substrate treating apparatus for performing a series of treatments of substrates such as semiconductor wafers, glass substrates for liquid crystal displays, glass substrates for photomasks, and substrates for optical disks (hereinafter called simply "substrates").

(2) Description of the Related Art

Conventionally, such a substrate treating apparatus is used, for example, in a photolithographic process for forming photoresist film on substrates, exposing the substrates having the photoresist film formed thereon, and developing the exposed substrates.

This apparatus will be described with reference to a plan view shown in FIG. 1. This substrate treating apparatus includes an indexer 103 having a cassette table 101 for receiving a plurality of cassettes C each for containing a plurality of (e.g. 25) wafers W to be treated, or wafers W having been treated in treating modules 104 described hereinafter, and a transport mechanism 108a movable horizontally along the cassettes C for transporting the wafers W between the cassettes C and treating modules 104. The apparatus further includes, besides the treating modules 104, a main substrate transport path 105 along which the wafers W are transported from one treating module 104 to another, and an interface 106 for transferring the wafers W between the treating modules 104 and an external treating apparatus 107.

The external treating apparatus 107 is an apparatus separate from the substrate treating apparatus, and is detachably attached to the interface 106 of the substrate treating apparatus. Where the substrate treating apparatus is designed for resist application and development as noted above, the external treating apparatus 107 is an exposing apparatus for exposing the wafers W.

The substrate treating apparatus further includes a main transport mechanism 108b movable along the main substrate transport path 105, and a transport mechanism 108c movable along a transport path of the interface 106. In addition, a table 109a is disposed at a connection between the indexer 103 and main substrate transport path 105, and a table 109b at a connection between the main substrate transport path 105 and interface 106.

The above substrate treating apparatus performs substrate treatment through the following procedure. The transport mechanism 108a takes one wafer W out of a cassette C containing wafers W to be treated, and transports this wafer W to the table 109a to pass the wafer W to the main transport mechanism 108b. The main transport mechanism 108b, after receiving the wafer W placed on the table 109a, transports the wafer W into each treating module 104 for a predetermined treatment (e.g. resist application) in the treating module 104. Upon completion of each predetermined treatment, the main transport mechanism 108b takes the wafer W out of the treating module 104, and transports the wafer W into another treating module 104 for a next treatment (e.g. heat treatment).

After the series of pre-exposure treatment is completed, the main transport mechanism 108b transports the wafer W treated in the treating modules 104 to the table 109b, and deposits the wafer W on the table 109b to pass the wafer W to the transport mechanism 108c. The transport mechanism 108c receives the wafer W placed on the table 109b and transports the wafer W to the external treating apparatus 107. The transport mechanism 108c loads the wafer W into the external treating apparatus 107 and, after a predetermined treatment (e.g. exposure), takes the wafer W out of the external treating apparatus 107 to transport it to the table 109b. Subsequently, the main transport mechanism 108b transports the wafer W to the treating modules 104 where a series of post-exposure heating and cooling treatment and development is performed. The wafer W having gone through all the treatment is loaded by the transport mechanism 108a into a predetermined cassette C. The cassette C is transported away from the cassette table 101 to complete a series of substrate treatment.

The conventional apparatus having such a construction has the following drawback.

In the conventional substrate treating apparatus, the single main transport mechanism 108b movable along the main substrate transport path 105 transports the wafer W to and from all the processing units 104. Because of its working speed, the main transport mechanism 108b cannot access many processing units 104 within a short time. Consequently, the conventional substrate treating apparatus cannot meet the present-day requirement for improvement in throughput.

SUMMARY OF THE INVENTION

This invention has been made having regard to the state of the art noted above, and its primary object is to provide a substrate treating apparatus with improved throughput.

The above object is fulfilled, according to this invention, by a substrate treating apparatus for performing a series of chemical treatments and heat treatments on substrates, comprising a plurality of treating blocks arranged in juxtaposition, each for performing a different chemical treatment, each of the treating blocks including a chemical treating module for performing the different chemical treatment, a heat-treating module for performing heat treatment relating to the different chemical treatment, and a single main transport mechanism for transporting the substrates between the chemical treating module and the heat-treating module.

According to this invention, substrates receive a series of chemical treatments and heat treatments successively performed in the plurality of treating blocks arranged in juxtaposition. In the respective treating blocks, the main transport mechanisms transfer the substrates to and from the chemical treating module and heat-treating module in parallel. That is, with the main transport mechanisms of the respective treating blocks operable simultaneously and in parallel, the transfer of substrates to and from the treating modules is expedited equivalently, thereby to improve the throughput of the substrate treating apparatus.

In the above substrate treating apparatus, the main transport mechanism of each treating block, preferably, shares a substantially equal number of transport steps, where one transport step is a step of transporting each substrate from a particular position to a different position.

When performing a series of substrate treatments successively by using a plurality of transport mechanisms, a particular transport mechanism may have an increased transport load so that more than a certain number of substrates cannot be treated per unit time. Then, even though the other transport mechanisms have elbowroom, improvement in treating efficiency cannot be expected of the substrate treating apparatus as a whole. According to this invention, the main transport mechanism of each treating block shares a substantially equal number of transport steps. This avoids a situation where only a particular main transport mechanism reaches the limit of transporting process earlier than the other main transport mechanisms. As a result, the substrate treating apparatus provides improved throughput.

In the substrate treating apparatus according to this invention, the main transport mechanism of each treating block, preferably, transfers the substrates to an adjacent one of the treating blocks through a substrate rest provided for receiving the substrates to be transferred. Then, the main transport mechanism of a certain treating block can proceed to a next process only by placing on the substrate rest a substrate for which treatment in that treating block has been completed. That is, treatment can be carried out regardless of an operating state of the main transport mechanism of an adjoining treating block. Thus, the throughput of the substrate treating apparatus may be further promoted.

The substrate rest, preferably, includes at least two substrate rests, i.e. a substrate feeding rest for feeding the substrates from one of the treating blocks, and a substrate returning rest for returning the substrates to the one of the treating blocks. With this construction, the two substrate rests may be used to feed a substrate forward from a certain treating block (unloading), and return a substrate to the treating block (loading) at substantially the same time. Thus, the throughput of the substrate treating apparatus may be further promoted.

The substrate feeding rest and substrate returning rest, preferably, are arranged vertically and close to each other. When loading and unloading substrates by using a single main transport mechanism, this preferred arrangement realizes a shortened traveling distance of the main transport mechanism to improve the throughput of the substrate treating apparatus.

This invention is not limited to a particular location of the substrate rest. Where an atmosphere-shielding partition is provided between adjacent treating blocks, the substrate rest, preferably, extends partially through the partition. This construction minimizes an atmospheric interaction between the adjacent treating blocks, and realizes a smooth transfer of substrates between the treating blocks.

Preferably, the substrate rest includes a sensor for detecting the substrates. Then, the sensor outputs a detection signal for allowing a determination whether the main transport mechanism can transfer substrates to the substrate rest. This is effective to avoid the trouble of placing one substrate over another on the substrate rest, and a wasteful movement of the main transport mechanism such as "empty pickup".

The chemical treating module, heat-treating module and main transport mechanism may be arranged in any desired layout within each treating block. It is preferred, however, that the chemical treating module and the heat-treating module are opposed to each other across the main transport mechanism. In this arrangement, the chemical treating module and heat-treating module are spaced apart from each other. Thus, the chemical treating module undergoes reduced thermal influences of the heat-treating module.

In this invention, each treating block, preferably, includes a plurality of chemical treating modules arranged vertically, and a plurality of heat-treating modules arranged vertically. With the chemical treating modules and heat-treating modules arranged vertically in multiple stages, respectively, the substrate treating apparatus occupies a reduced area.

Preferably, the heat-treating modules are arranged vertically in a plurality of columns erected side by side. This arrangement facilitates maintenance of the heat-treating modules, and eliminates the need to extend to a great height, ducting, piping and power supply lines required for the heat-treating modules.

This invention is not limited to a particular construction of the heat-treating module. Preferably, however, the heat-treating module is a heat-treating module with a temporary substrate deposit, and having a heating plate for supporting and heating a substrate, the temporary substrate deposit for holding the substrate in an upper or lower position away from the heating plate, and a local transport mechanism for transporting the substrate between the heating plate and the temporary substrate deposit. With this heat-treating module having the temporary substrate deposit, a heat-treated substrate may be moved from the heating plate to the temporary substrate deposit for standby regardless of operation of the main transport mechanism. This avoids a situation where the substrate is heated to excess because the main transport mechanism is engaged in other operations, or because of some fault. Not all the heat-treating modules need to have the temporary substrate deposits. Such heat-treating modules may be those with great necessity to prevent excessive heating.

The local transport mechanism of the heat-treating module with the temporary substrate deposit, preferably, includes a cooling device for cooling the substrate while transporting the substrate from the heating plate to the temporary substrate deposit. This construction immediately cools the substrate picked up from the heating plate. In other words, the substrate is not heated by residual heat during transport, and thus the time for heating substrates is strictly controllable to improve the quality of substrate treatment.

Further, the main transport mechanism, preferably, transfers the substrate to and from the temporary substrate deposit. If the main transport mechanism accesses the heating plate of the heat-treating module, the main transport mechanism may be heated to impart adverse thermal influences on the substrate transported by the main transport mechanism. As opposed to this, where the main transport mechanism transfers substrates to and from the temporary substrate deposit, a temperature increase of the main transport mechanism can be avoided to promote the quality of substrate treatment.

Preferably, at least the heating plate is enclosed in a housing defining an opening for allowing the local transport mechanism to load and unload the substrate on/from the heating plate, the opening being located in a side remote from a side accessed by the main transport mechanism. With this construction, the hot atmosphere escaping through the opening has reduced influences on the main transport mechanism, to further suppress a temperature increase of the main transport mechanism.

In another aspect of the invention, a substrate treating apparatus for performing a series of chemical treatments and heat treatments on substrates, comprises an indexer block including a cassette table for receiving a plurality of cassettes each for containing a plurality of substrates in multiple stages, and an indexer's transport mechanism for successively fetching substrates to be treated from each cassette, and successively depositing treated substrates in each cassette; an antireflection film forming block disposed adjacent the indexer block, and including antireflection film coating modules for coating antireflection film on surfaces of substrates, antireflection film heat-treating modules for heat-treating the substrates in relation to antireflection film coating, and a first main transport mechanism for transferring the substrates to and from the antireflection film coating modules and the antireflection film heat-treating modules; a resist film forming block disposed adjacent the antireflection film forming block, and including resist film coating modules for coating photoresist film on the substrates having the antireflection film formed thereon, resist film heat-treating modules for heat-treating the substrates in relation to photoresist film coating, and a second main transport mechanism for transferring the substrates to and from the resist film coating modules and the resist film heat-treating modules; a developing block disposed adjacent the resist film forming block, and including developing modules for developing the substrates having the photoresist film formed thereon and exposed, heat-treating modules for development for heat-treating the substrates in relation to development, and a third main transport mechanism for transferring the substrates to and from the developing modules and the heat-treating modules for development; and an interface block disposed adjacent the developing block and including an interface's transport mechanism for transferring the substrates to and from an exposing apparatus provided separately from and externally of the substrate treating apparatus.

According to this invention, a substrate to be treated is passed from the indexer block to the antireflection film forming block. The substrate is coated with antireflection film in this treating block. The substrate coated with antireflection film is passed to the resist film forming block. The substrate is coated with photoresist film in this treating block. The substrate coated with photoresist film is passed through the developing block without treatment to the interface block. The interface block passes the substrate to the exposing apparatus which is an external apparatus. The exposed substrate is passed to the developing block through the interface block to be developed in the developing block. The developed substrate is passed through the resist film forming block and antireflection film forming block without treatment, back to the indexer block. The indexer block deposits the treated substrate in a cassette. In the respective treating blocks, the main transport mechanisms transfer substrates to and from the chemical treating modules (i.e. antireflection film coating modules, resist film coating modules, and developing modules) and heat-treating modules in parallel. That is, with the main transport mechanisms of the respective treating blocks operable simultaneously and in parallel, the transfer of substrates to and from the treating modules is expedited equivalently, thereby to improve the throughput of the substrate treating apparatus.

In the above substrate treating apparatus, at least the indexer block and the antireflection film forming block, preferably, are divided by a partition defining an opening for allowing substrate transfer, the antireflection film forming block having a higher atmospheric pressure than the indexer block. With this construction, the atmosphere in the indexer block does not flow into the antireflection film forming block. Thus, the substrates may be treated without influences of ambient atmosphere, to improve the quality of treatment.

It is preferred in the above substrate treating apparatus that the heat-treating modules of the developing block include heat-treating modules with temporary substrate deposits, each having a heating plate for supporting and heating a substrate, a temporary substrate deposit for holding the substrate in an upper or lower position away from the heating plate, and a local transport mechanism for transporting the substrate between the heating plate and the temporary substrate deposit, and that the interface block further includes edge exposing modules for exposing peripheries of the substrates coated with photoresist, and a fourth main transport mechanism for transferring the substrates to and from the heat-treating modules with temporary substrate deposits and the edge exposing modules. With this construction, a substrate coated with photoresist film is passed through the developing block, without treatment, to the fourth main transport mechanism in the interface block to be loaded into one of the edge exposing modules. The edge-exposed substrate is passed to the external, exposing apparatus by the interface's transport mechanism. The exposed substrate is passed from the interface's transport mechanism to the fourth main transport mechanism to be loaded into one of the heat-treating modules with temporary substrate deposits. The heat-treated substrate is passed to the developing block to be developed. The exposed substrate is transported and loaded into the heat-treating module with temporary substrate deposit by the independent, fourth main transport mechanism instead of the third main transport mechanism of the developing block. This ensures the heating treatment after exposure even when the third main transport mechanism comes to a stoppage due to some abnormality in the developing block. Where a chemically amplified photoresist is used, it is necessary to perform heating after exposure promptly. This invention is advantageous in this respect.

The above local transport mechanism may include a cooling device for cooling the substrate while transporting the substrate from the heating plate to the temporary substrate deposit. This is advantageous in that a heating time after exposure may be controlled more strictly.

It is preferred in the substrate treating apparatus according to this invention that the indexer's transport mechanism and the first main transport mechanism transfer the substrates to each other through a substrate rest provided for receiving the substrates to be transferred, and that the first main transport mechanism and the second main transport mechanism, the second main transport mechanism and the third main transport mechanism, the third main transport mechanism and the fourth main transport mechanism, and the fourth main transport mechanism and the interface's transport mechanism transfer the substrates to each other through substrate rests provided for receiving the substrates to be transferred. With this construction, the main transport mechanism of each treating block can proceed to a next process only by placing on the substrate rest a substrate for which treatment in that treating block has been completed. Thus, the throughput of the substrate treating apparatus may be further promoted.

It is preferred in the substrate treating apparatus according to this invention that the interface block further includes a feed buffer for temporarily storing substrates to be exposed, when the exposing apparatus cannot accept the substrates, and a substrate return buffer for temporarily storing substrates to be developed, when exposed substrates cannot be developed, that the interface's transport mechanism deposits the substrates to be exposed in the feed buffer when the exposing apparatus cannot accept the substrates, and that the fourth transport mechanism deposits the substrates to be developed in the return buffer, after the substrates to be developed are heat-treated in the heat-treating modules with temporary substrate deposits of the developing block, when the exposed substrates cannot be developed. With this construction, when the substrates cannot be developed due to some abnormality in the developing block, for example, the exposed and heated substrates are temporarily stored in the return buffer. The exposed substrates are never left standing for a long time without being heat-treated. This construction is advantageous particularly where a chemically amplified photoresist is used which requires to be heated promptly after exposure.

In a further aspect of the invention, a substrate treating apparatus comprises a plurality of controlled units arranged in juxtaposition, each including treating modules for performing required treatment of substrates, and a single main transport mechanism for transporting to and from the treating modules, wherein the main transport mechanisms of the controlled units transfer the substrates to each other through substrate rests provided for receiving the substrates to be transferred; each of the controlled units has a control device for controlling at least a substrate transfer operation of the main transport mechanism of each controlled unit; and the control device of each controlled unit is independently operable to control a series of substrate transport steps including transfer of the substrates to and from the treating modules and transfer of the substrates to and from the substrate rests.

This intention is intended to improve the throughput of the substrate treating apparatus from a control aspect also. The control system of this invention is what is known as a decentralized control. For this purpose, the substrates are transferred between the controlled units through the substrate rests. The task assigned to the control device of each controlled unit is only a series of controls, starting with receipt of a substrate from a predetermined substrate rest, and finishing with placement of the substrate on a predetermined substrate rest. That is, it is not necessary to consider movement of the main transport mechanism in the adjoining controlled unit. Thus, the control device of each controlled unit has a reduced load to improve the throughput of the substrate treating apparatus. The number of controlled units may also be increased or decreased relatively easily. As opposed to this, conventional substrate treatment is performed under centralized control of substrate transport mechanisms and treating units. A complicated determination (scheduling) must be made regarding an order of operation of the substrate transport mechanisms and treating units. This is one of the causes that hamper improvement in throughput.

As a specific example of substrate treating apparatus according to this invention, one of the controlled units is in form of an indexer block including a cassette table for receiving a plurality of cassettes each for containing a plurality of substrates in multiple stages, and an indexer's transport mechanism for successively fetching substrates to be treated from each cassette, and successively depositing treated substrates in each cassette; a second one of the controlled units is in form of an antireflection film forming block including antireflection film coating modules for coating antireflection film on surfaces of substrates, antireflection film heat-treating modules for heat-treating the substrates in relation to antireflection film coating, and a first main transport mechanism for transferring the substrates to and from the antireflection film coating modules and the antireflection film heat-treating modules; a third one of the controlled units is in form of a resist film forming block including resist film coating modules for coating photoresist film on the substrates having the antireflection film formed thereon, resist film heat-treating modules for heat-treating the substrates in relation to photoresist film coating, and a second main transport mechanism for transferring the substrates to and from the resist film coating modules and the resist film heat-treating modules; a fourth one of the controlled units is in form of a developing block including developing modules for developing the substrates having the photoresist film formed thereon and exposed, heat-treating modules for development for heat-treating the substrates in relation to development, and a third main transport mechanism for transferring the substrates to and from the developing modules and the heat-treating modules for development; and a fifth one of the controlled units is in form of an interface block including an interface's transport mechanism for transferring the substrates to and from an exposing apparatus provided separately from and externally of the substrate treating apparatus.

This invention provides the following effects besides improving the throughput of the substrate treating apparatus. The heat-treating modules for post-exposure heating and the fourth main transport mechanism constitute one controlled unit. Thus, exposed substrates may promptly be loaded into the heat-treating modules for heat treatment. This construction is advantageous particularly where a chemically amplified photoresist is used which requires to be heated promptly after exposure.

As noted hereinbefore, this invention can increase or decrease the number of controlled units relatively easily. For example, the substrate treating apparatus may further comprise a substrate inspecting controlled block including substrate inspecting modules for inspecting the substrates, and a main transport mechanism for substrate inspection for transferring the substrates to and from the substrate inspecting modules. With this construction, the substrate inspecting controlled block inspects the substrates under complete control, using its own main transport mechanism. Thus, the substrates may be inspected without substantially lowering the throughput.

In a still further aspect of the invention, a substrate treating apparatus comprises a plurality of controlled units arranged in juxtaposition, each for performing a different chemical treatment, each of the controlled units including chemical treating modules for performing the different chemical treatment, heat-treating modules for performing heat treatment relating to the different chemical treatment, and a single main transport mechanism for transporting the substrates between the chemical treating modules and the heat-treating modules, wherein the main transport mechanism of each controlled unit shares a substantially equal number of transport steps, where one transport step is a step of transporting each substrate from a particular position to a different position.

According to this invention, substantially the same number of transport steps is assigned to the main transport mechanism of each controlled unit. This avoids a situation where a particular main transport mechanism reaches the limit of transporting process earlier than the other main transport mechanisms. As a result, the substrate treating apparatus provides improved throughput.

In this invention, the main transport mechanisms of the respective controlled units (or treating blocks noted hereinbefore) do not have to perform exactly the same number of transport steps. The transport loads of the main transport mechanisms of principal controlled units may be equalized to the extent of improving the throughput of the substrate treating apparatus. In reality, variations in the number of transport steps assigned to the main transport mechanisms of the principal controlled units, desirably, do not exceed two transport steps. Where the processing time of a particular controlled unit needs to be managed strictly, or where another treating unit is likely to be incorporated as an option into one of the controlled units, an allowance or elbowroom may be given to the main transport mechanism of that controlled unit by setting a lower transport load thereto than to the main transport mechanisms of the other controlled units.

BRIEF DESCRIPTION OF THE DRAWINGS

For the purpose of illustrating the invention, there are shown in the drawings several forms which are presently preferred, it being understood, however, that the invention is not limited to the precise arrangement and instrumentalities shown.

FIG. 11 is a view showing flows of wafer transport by first to fourth main transport mechanisms.

DESCRIPTION OF THE PREFERRED EMBODIMENTS

A preferred embodiment of this invention will be described in detail hereinafter with reference to the drawings.

Figure 1:
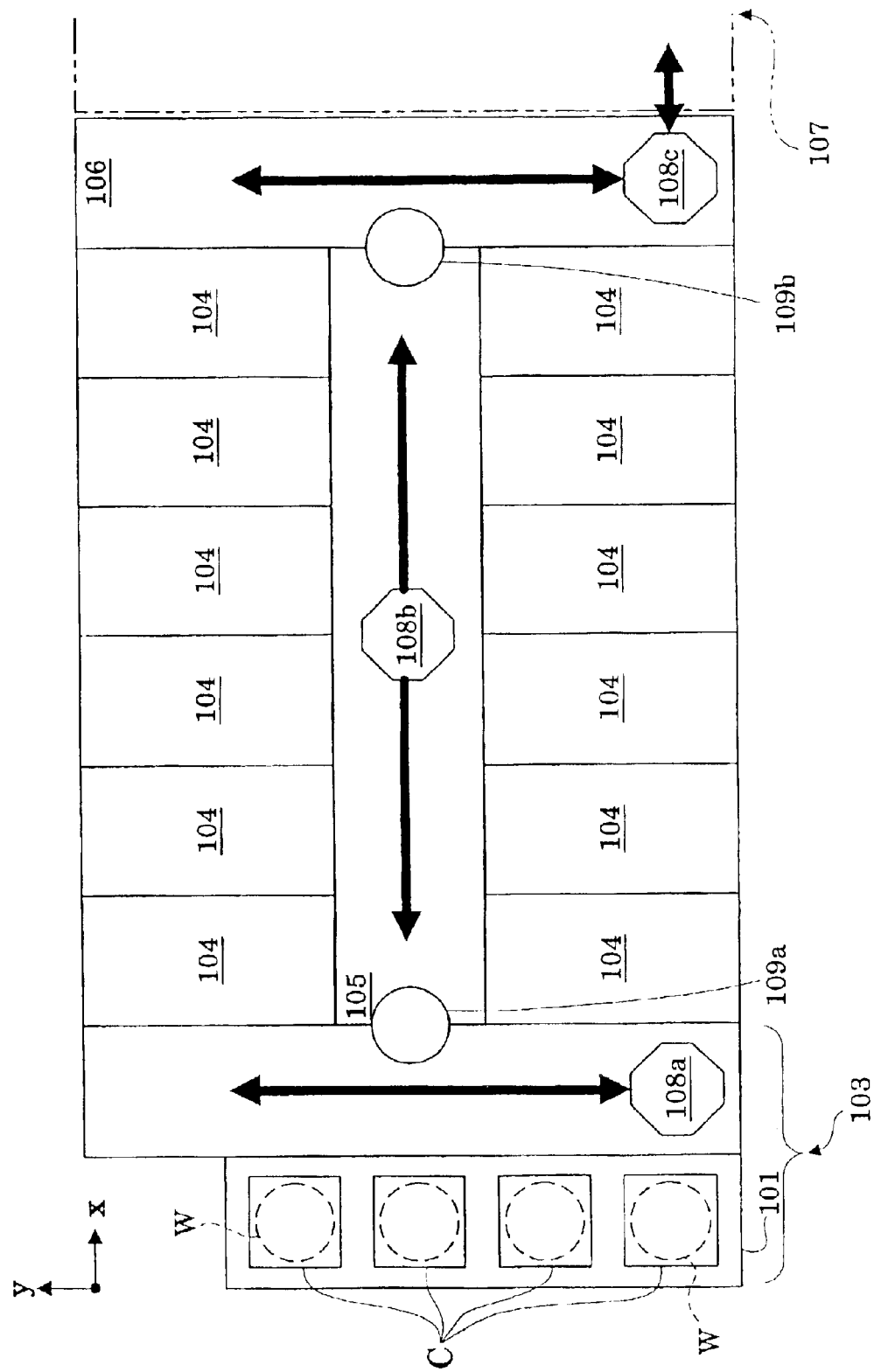
FIG. 1 is a plan view showing the construction of a conventional substrate treating apparatus.
Figure 2:
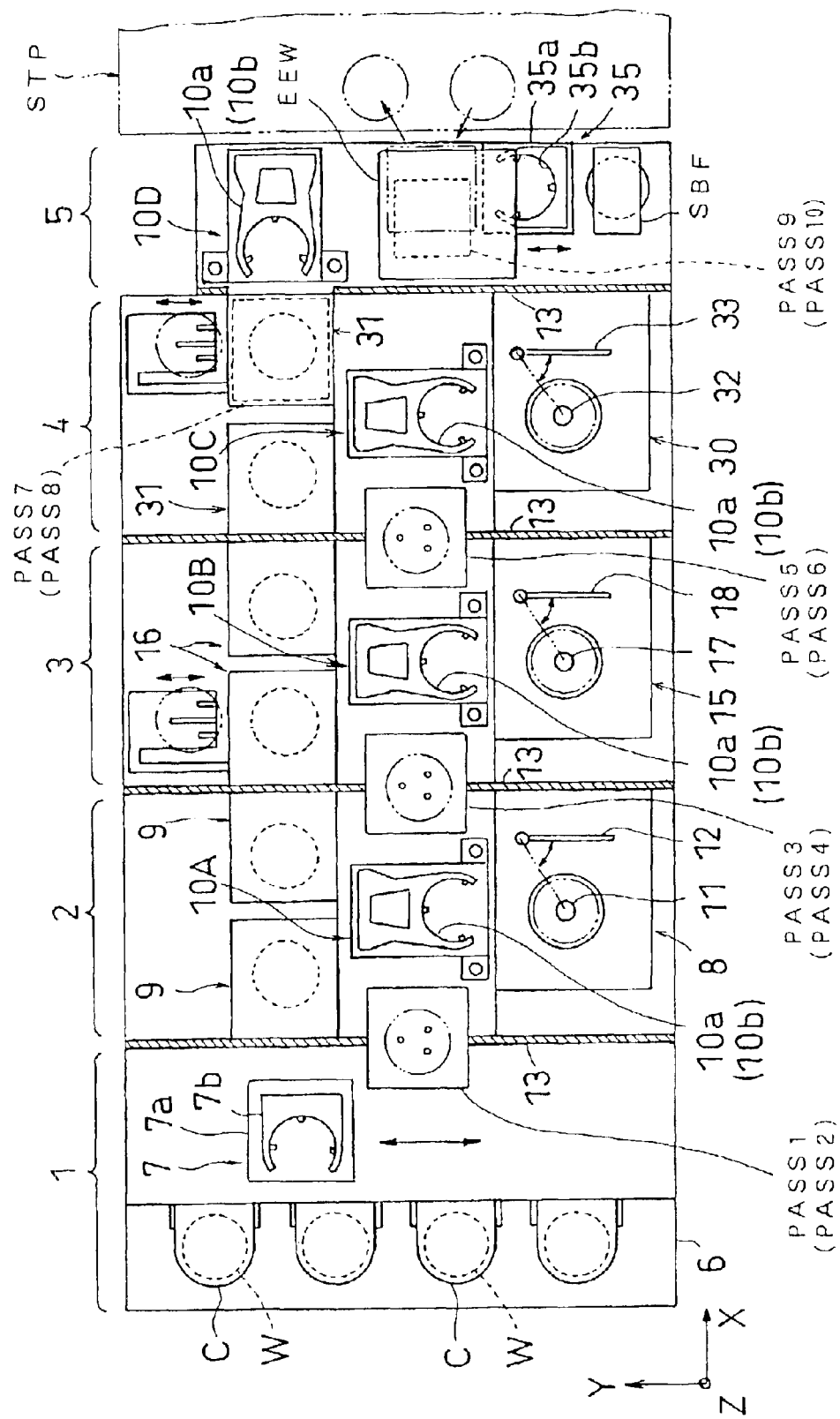
FIG. 2 is a plan view showing an outline of a substrate treating apparatus according to this invention.
Figure 3:
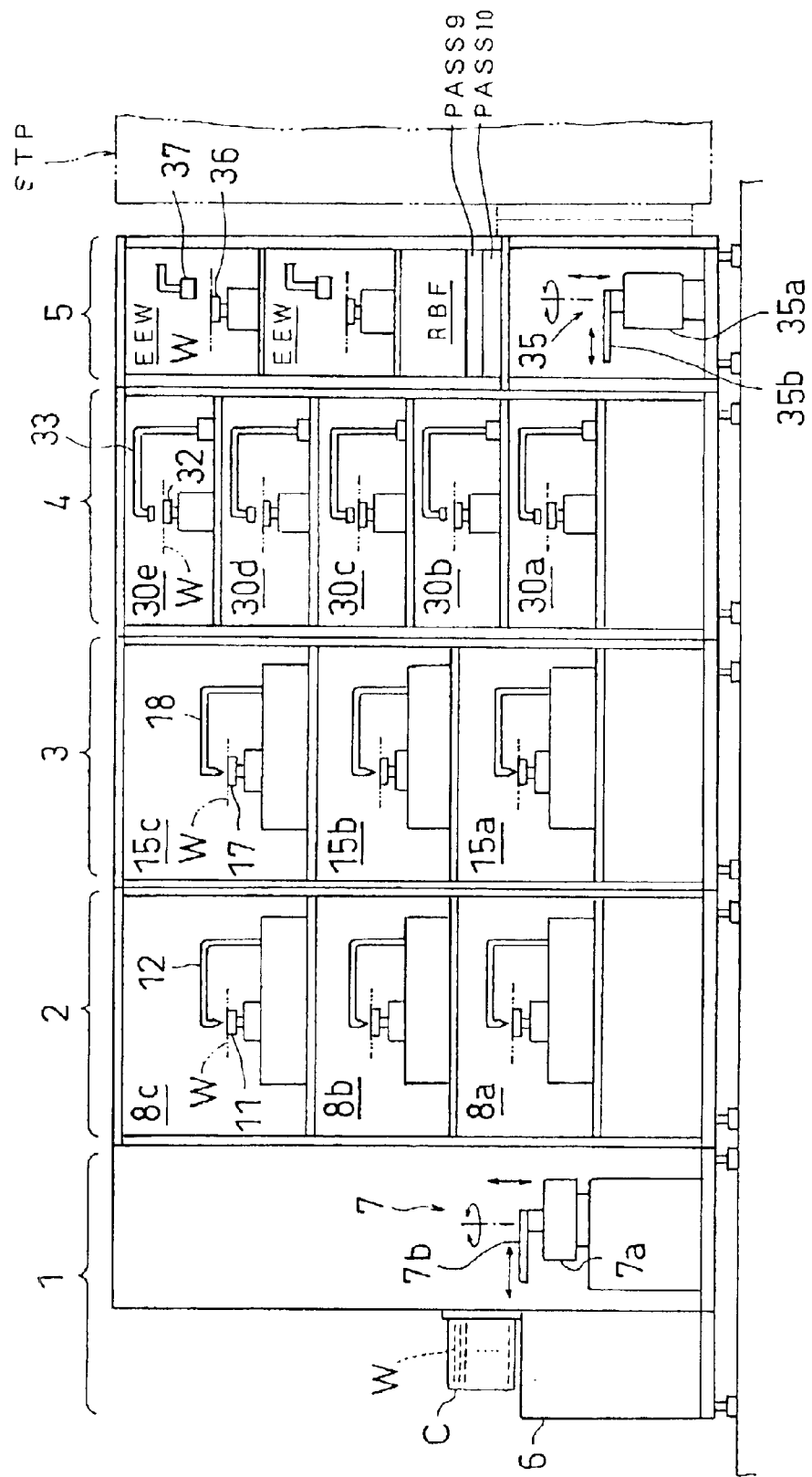
FIG. 3 is a front view showing an outline of the substrate treating apparatus according to this invention.
Figure 4:
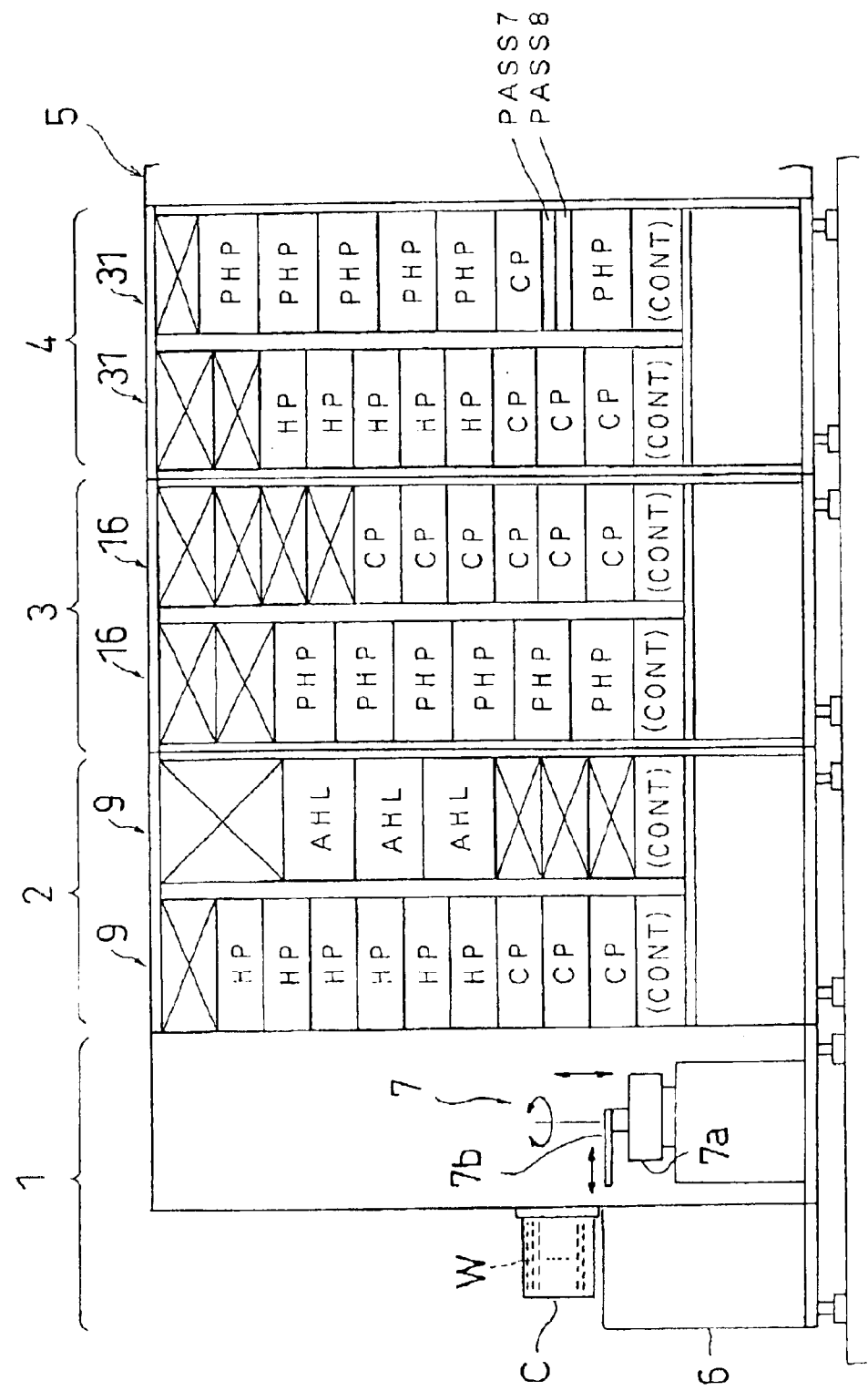
FIG. 4 is a front view of heat-treating modules.

FIG. 2 is a plan view showing an outline of a substrate treating apparatus according to this invention. FIG. 3 is a front view of the apparatus. FIG. 4 is a front view of heat-treating modules.

This substrate treating apparatus is constructed to perform chemical treatment for forming antireflection film and photoresist film on semiconductor wafers (hereinafter called simply "substrates or wafers"), and developing exposed substrates. The substrates handled by the substrate treating apparatus according to this invention are, of course, not limited to semiconductor wafers, but include various substrates such as glass substrates for liquid crystal displays. The chemical treatment is not limited to formation of photoresist film or the like or development, but includes various other chemical treatments.

FIG. 2 refers. The substrate treating apparatus in this embodiment, broadly, includes an indexer block 1, three treating blocks for performing required chemical treatments on the substrates (specifically, an antireflection film forming block 2, a resist film forming block 3 and a developing block 4), and an interface block 5. These blocks are arranged side by side. The interface block 5 communicates with an exposing apparatus (e.g. stepper) STP which is an external apparatus separate from the substrate treating apparatus in this embodiment. The construction of each block will be described hereinafter.

The indexer block 1 will be described first. The indexer block 1 is a mechanism for fetching wafers W from cassettes C each for containing a plurality of wafers W in multiple stages, and depositing wafers W in the cassettes C. Specifically, the indexer block 1 includes a cassette table 6 for receiving a plurality of cassettes C in juxtaposition, and an indexer's transport mechanism 7 for successively fetching wafers W to be treated from each cassette C, and successively depositing treated wafers W in each cassette C. The transport mechanism 7 has a movable base 7a for horizontal movement (in Y-direction) along the cassette table 6. A holding arm 7b is mounted on the movable base 7a for holding a wafer W in horizontal posture. On the movable base 7a, the holding arm 7b is vertically movable (in Z-direction), swingable in a horizontal plane, and extendible and retractable radially of the swinging movement.

Figure 5:
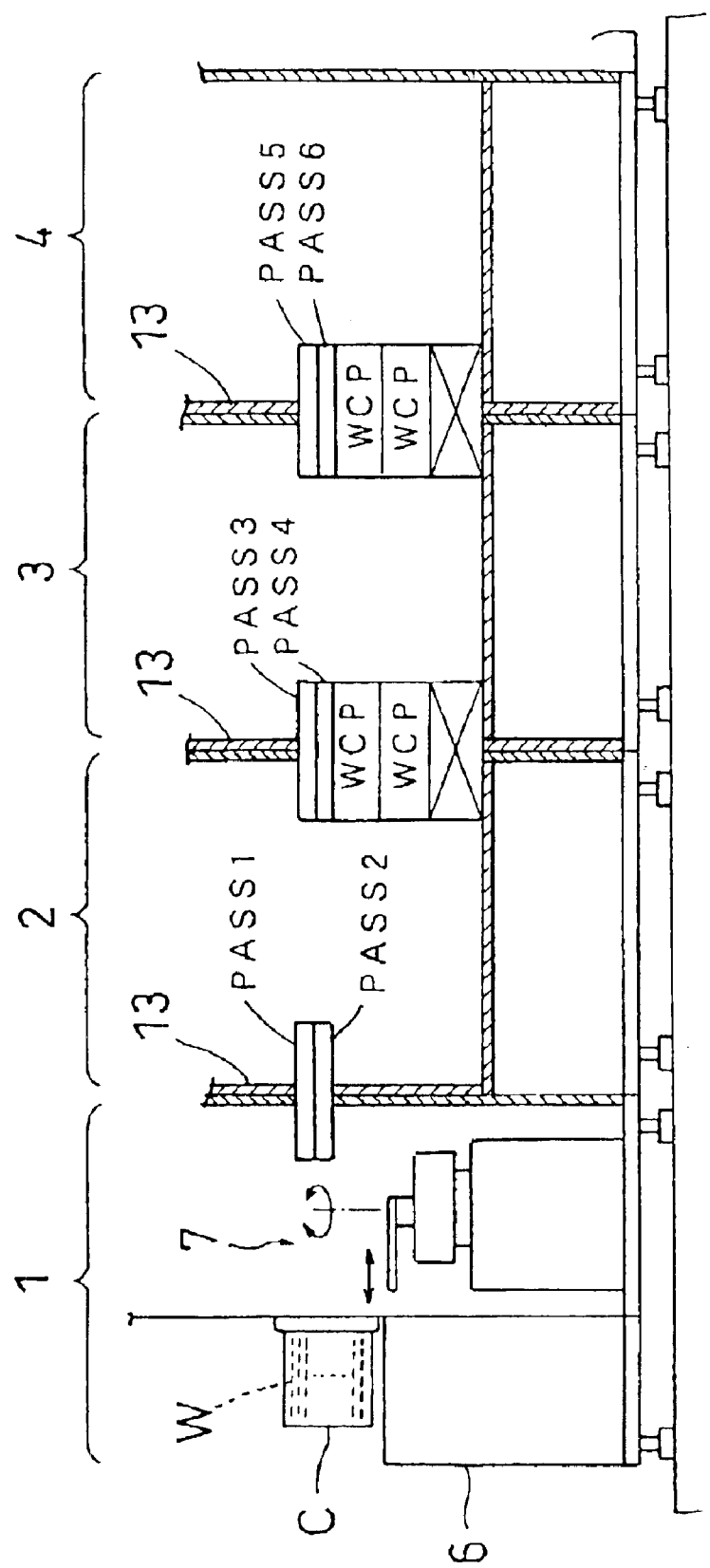
FIG. 5 is a sectional front view showing arrangements around substrate rests provided on partitions.

The antireflection film forming block 2 is disposed adjacent the indexer block 1. As shown in FIG. 5, an atmosphere shielding partition 13 is formed between the indexer block 1 and antireflection film forming block 2. The partition 13 has two substrate rests PASS1 and PASS2 arranged one over the other and close to each other for receiving wafers W to be transferred between the indexer block 1 and antireflection film forming block 2. The upper substrate rest PASS1 is used to feed wafers W from the indexer block 1 to the antireflection film forming block 2. The lower substrate rest PASS2 is used to return wafers W from the antireflection film forming block 2 to the indexer block 1. The substrate rests PASS1 and PASS2 partially extend through the partition 13. Each of the substrate rests PASS1 and PASS2 has a plurality of fixed support pins. This is the case also with other substrate rests PASS3–PASS10 to be described hereinafter. The substrate rests PASS1 and PASS2 include optical sensors, not shown, for detecting wafers W. A detection signal of each sensor is used for determining whether the substrate rest PASS1 or PASS2 is in a state for transferring a wafer W to or from the indexer's transport mechanism 7 or a first main transport mechanism 10A, to be described hereinafter, of the antireflection film forming block 2. Similar sensors are provided for the other substrate rests PASS3–PASS10 also.

The antireflection film forming block 2 will be described. The antireflection film forming block 2 is a mechanism for forming antireflection film under photoresist film in order to reduce standing wave and halation occurring in time of exposure. Specifically, this block 2 includes antireflection film coating modules 8 for coating the surfaces of wafers W with antireflection film, antireflection film heat-treating modules 9 for heat-treating the wafers W in relation to formation of the antireflection film, and the first main transport mechanism 10A for transferring the wafers W to and from the antireflection film coating modules 8 and antireflection film heat-treating modules 9.

In the antireflection film forming block 2, the coating modules 8 and heat-treating modules 9 are opposed to each other across the first main transport mechanism 10A. Specifically, the coating modules 8 are disposed in a front area of the apparatus, while the heat-treating modules 9 are disposed in a rear area of the apparatus. The other, resist film forming block 3 and developing block 4 also share the above feature of arranging the chemical treating modules and heat-treating modules in opposite areas across the main transport mechanism. In such an arrangement, the chemical treating modules and heat-treating modules are spaced away from each other, and hence a reduced chance of the chemical treating modules coming under the thermal influence of the heat-treating modules. In this embodiment, heat barriers, not shown, are formed in front of the heat-treating modules 9 to avoid the thermal influence on the antireflection film coating modules 8. Similar heat barriers are formed in the other, resist film forming block 3 and developing block 4 also.

As shown in FIG. 3, the antireflection film coating modules 8 consist of three antireflection film coating modules 8a–8c (hereafter referenced "8" where the individual coating modules are not distinguished) of the same construction arranged vertically. Each coating module 8 includes a spin chuck 11 for suction-supporting and spinning a wafer W in horizontal posture, and a nozzle 12 for supplying a coating solution to the wafer W held on the spin chuck 11 for forming antireflection film.

As shown in FIG. 4, the antireflection film heat-treating modules 9 include a plurality of heating plates HP for heating wafers W to a predetermined temperature, a plurality of cooling plates CP for cooling the heated wafers W to room temperature, and a plurality of adhesion modules AHL for heat-treating the wafers W in an atmosphere of HMDS (hexamethyldisilazane) vapor in order to promote adhesion of the resist film to the wafers W. These heat-treating modules 9 further include heater controllers (CONT) arranged in lower positions, and piping, wiring and reserve spaces allocated to upper positions (indicated by "X" mark in FIG. 4).

In the antireflection film heat-treating modules 9, these heat-treating modules HP, CP and AHL are stacked vertically, and the group of heat-treating modules is divided into a plurality of (two in this embodiment) columns standing side by side. The other, resist film forming block 3 and developing block 4 also share the above feature of the chemical treating modules arranged vertically and the group of vertically stacked heat-treating modules being divided into a plurality of columns.

The vertical arrangements of the chemical treating modules and the heat-treating modules in each of the treat blocks 2–4 have the effect of reducing the space occupied by the substrate treating apparatus. The group of vertically stacked heat-treating modules being divided into a plurality of columns provides the advantages of facilitating maintenance of the heat-treating modules, and eliminating the need to extend to a great height, ducting, piping and power supply lines required for the heat-treating modules.

The first main transport mechanism 10A will be described. The first main transport mechanism 10A has the same construction as the second, third and fourth main transport mechanisms 10B, 10C and 10D in the other, resist film forming block 3, developing block 4 and interface block 4. The first to fourth main transport mechanisms 10A-10D will be referred to hereinafter as the main transport mechanism(s) 10 where these transport mechanisms are not distinguished.

Figure 7A:
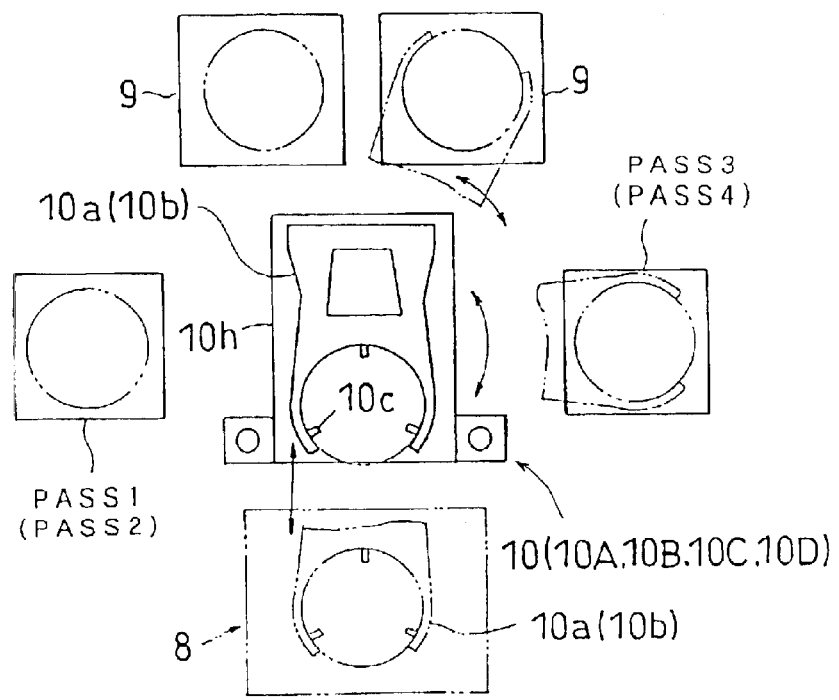
FIG. 7A is a plan view showing an outline of a main transport mechanism.
Figure 7B:
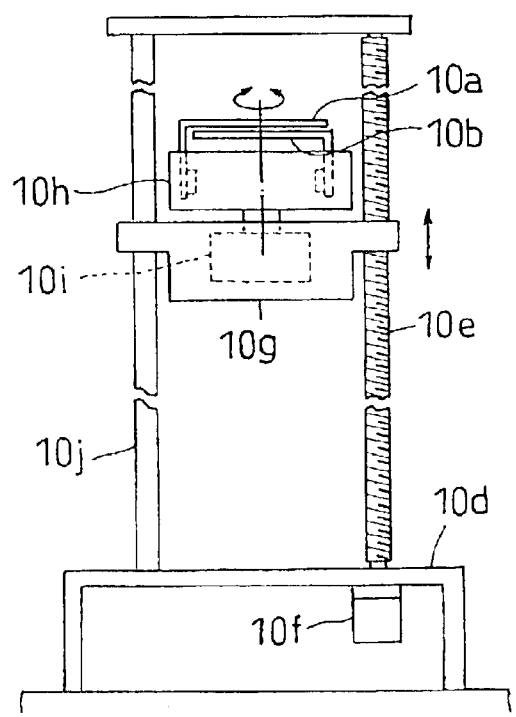
FIG. 7B is a front view showing an outline of the main transport mechanism.

Reference is made to FIGS. 7A and 7B. FIG. 7A is a plan view of the main transport mechanism 10. FIG. 7B is a front view thereof. The main transport mechanism 10 includes two holding arms 10a and 10b arranged vertically and close to each other for holding wafers W in horizontal posture. Each holding arm 10a or 10b has a C-shaped forward end, and a plurality of pins 10c projecting inwardly from inside the C-shaped end for supporting peripheries of wafer W from below. The main transport mechanism 10 has a base 10d fixed to a base of the apparatus. The base 10d rotatably supports a screw shaft 10e extending upward. A motor 10f is attached to the base 10d for rotating the screw shaft 10e. A lift deck 10g is meshed with the screw shaft 1e. When the motor 10f rotates the screw shaft 10e, the lift deck 10g moves vertically as guided by a guide rod 10j. An arm base 10h is mounted on the lift deck 10g to be rotatable about a vertical axis. A motor 10i is mounted in the lift deck 10g for rotating the arm base 10h. The two holding arms 10a and 10b noted above are arranged vertically on the arm base 10h. The holding arms 10a are 10b are extendible and retractable radially of rotation of the arm base 10h and independently of each other by drive mechanisms (not shown) mounted in the arm deck 10h.

The resist film forming block 3 is disposed adjacent the antireflection film forming block 2 described above. As shown in FIG. 5, an atmosphere shielding partition 13 is formed also between the antireflection film forming block 2 and resist film forming block 3. This partition 13 has two substrate rests PASS3 and PASS4 arranged one over the other and close to each other for receiving wafers W to be transferred between the antireflection film forming block 2 and resist film forming block 3. As are the substrate rests PASS1 and PASS2, the upper substrate rest PASS3 is used to feed wafers W and the lower substrate rest PASS4 to return wafers W. The substrate rests PASS3 and PASS4 partially extend through the partition 13. Two water-cooled cooling plates WCP extend through the partition 13 under the substrate rests PASS3 and PASS4 for cooling the wafers W in a general or broad way.

The resist film forming block 3 will be described. The resist film forming block 3 is a mechanism for forming photoresist film over the antireflection film formed on the wafers W. This embodiment uses a chemically amplified resist as photoresist. The resist film forming block 3 includes resist film coating modules 15 for applying and forming photoresist film on the wafers W coated with the antireflection film, resist film heat-treating modules 16 for heat-treating the wafers W in relation to formation of the photoresist film, and the second main transport mechanism 10B for transferring the wafers W to and from the resist film coating modules 15 and resist film heat-treating modules 16.

As shown in FIG. 3, the resist film coating modules 15 consist of three resist film coating modules 15a–15c (hereafter referenced "15" where the individual coating modules are not distinguished) of the same construction arranged vertically. Each coating module 15 includes a spin chuck 17 for suction-supporting and spinning a wafer W in horizontal posture, and a nozzle 18 for supplying a coating solution to the wafer W held on the spin chuck 17 for forming resist film.

As shown in FIG. 4, the resist film heat-treating modules 16 include a plurality of heating modules PHP, with temporary substrate deposits, for heating wafers W to a predetermined temperature, and a plurality of cooling plates CP for cooling the heated wafers W to room temperature with high precision. As in the antireflection film forming block 2, these heat-treating modules are arranged vertically and in a plurality of columns.

The heating modules PHP with temporary substrate deposits will be described.

Figure 8A:
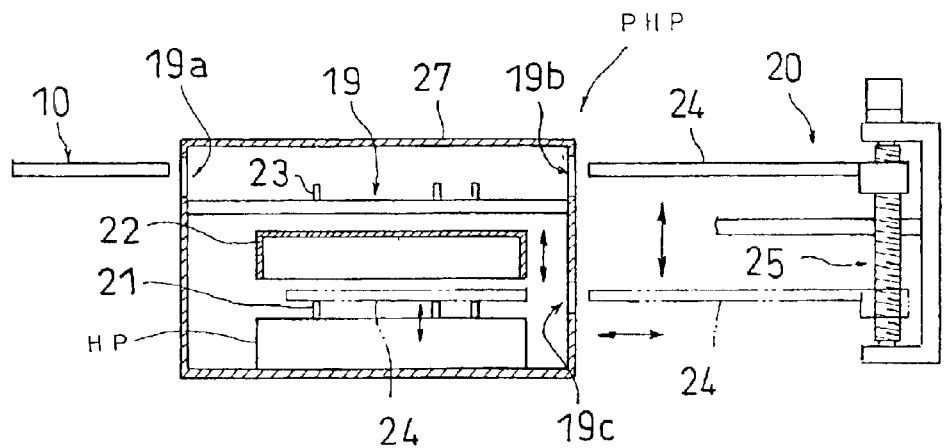
FIG. 8A is a sectional side view of a heating module with a temporary wafer deposit.
Figure 8B:
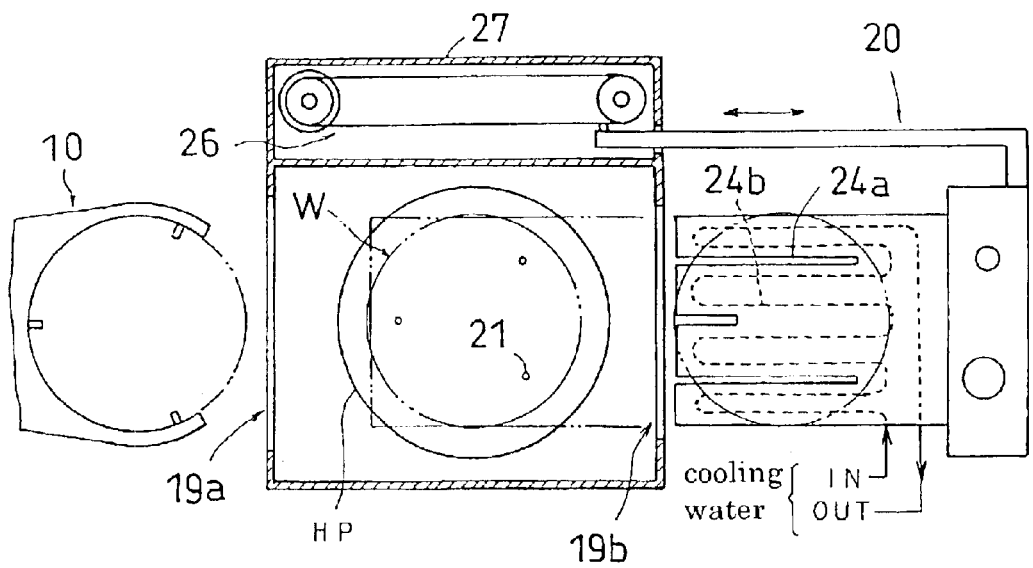
FIG. 8B is a sectional plan view of the heating module with the temporary wafer deposit.

Reference is made to FIGS. 8A and 8B. FIG. 8A is a sectional side view of one of the heating modules PHP with temporary wafer deposits. FIG. 8B is a sectional plan view thereof. The heating module PHP includes a heating plate HP for heating a wafer W placed thereon, a temporary substrate deposit 19 for keeping the wafer W in an upper position or lower position (upper position in this embodiment) away from the heating plate HP, and a local transport mechanism 20 for transporting the wafer W between the heating plate HP and temporary substrate deposit 19. The heating plate HP has a plurality of support pins 21 projectable above and retractable below the upper surface of the plate. An upper lid 22 is disposed above the heating plate HP to be vertically movable for covering the wafer W in time of heating treatment. The temporary substrate deposit 19 has a plurality of fixed support pins 23 for supporting the wafer W.

The local transport mechanism 20 includes a holding plate 24 for holding a wafer W in horizontal posture. The holding plate 24 is vertically movable by a screw feed mechanism 25, and extendible and retractable by a belt drive mechanism 26. The holding plate 24 defines a plurality of slits 24*a* to avoid interference with the movable support pins 21 or fixed support pins 23 when the holding plate 24 is extended over the heating plate HP or temporary substrate deposit 19. The local transport mechanism 20 includes a device for cooling a wafer W while transporting the wafer W from the heating plate HP to the temporary substrate deposit 19. This cooling device, for example, has a cooling water channel 24*b* formed inside the holding plate 24 for circulating cooling water.

The local transport mechanism 20 is opposed to the second main transport mechanism 10B across the heating plate HP and temporary substrate deposit 19. That is, the local transport mechanism 20 is disposed adjacent the rear surface of the apparatus. The heating plate HP and temporary substrate deposit 19 are enclosed in a housing 27. The housing 27 has an opening 19*a* formed in the front wall of an upper portion thereof covering the temporary substrate deposit 19 for allowing entry of the second main transport mechanism 10B and an opening 19*b* formed in the rear wall of the upper portion for allowing entry of the local transport mechanism 20. Further, the housing 27 has a closed front surface in a lower portion thereof covering the heating plate HP, and an opening 19*c* formed in the rear wall of the lower portion for allowing entry of the local transport mechanism 20.

A wafer W is loaded into and unloaded from the above heating module PHP as follows. First, the main transport mechanism 10 (the second main transport mechanism 10B in the case of the resist film forming block 3) places a wafer W on the fixed support pins 23 of temporary substrate deposit 19. Then, the holding plate 24 of the local transport mechanism 20 advances under the wafer W and slightly ascends to pick up the wafer W from the fixed support pins 23. The holding plate 24 holding the wafer W leaves the housing 27, and descends to a position opposed to the heating plate HP. At this time, the movable support pins 21 of the heating plate HP are in the lowered position, and the upper lid 22 is raised. The holding plate 24 holding the wafer W advances over the heating plate HP. The movable support pins 21 are raised to pick up the wafer W, and thereafter the holding plate 24 leaves the housing 27. Then, the movable support pins 21 are lowered to lay the wafer W on the heating plate HP. The upper lid 22 is lowered to cover the wafer W. The wafer W is heated in this state. After the heating treatment, the upper lid 22 is raised. The movable support pins 21 are raised to pick up the wafer W. The holding plate 24 advances under the wafer W, and then the movable support pins 23 are lowered to lay the wafer W on the holding plate 24. The holding plate 24 holding the wafer W leaves the housing 27, moves up and transports the wafer W into the temporary substrate deposit 19. The wafer W supported by the holding plate 24 in this transporting process is cooled by the cooling function of the holding plate 24. The holding plate 24 transfers the cooled (i.e. returned to room temperature) wafer W to the temporary substrate deposit 19. The main transport mechanism 10 takes out and transports the wafer W.

As described above, the main transport mechanism 10 transfers wafers W to and from the temporary substrate deposit 19 only, and not to and from the heating plate HP. Thus, the main transport mechanism 10 is free from temperature increase. Further, the opening 19*c* for loading and unloading wafers W on/from the heating plate HP is located in the side remote from the main transport mechanism 10. Thus, the main transport mechanism 10 is not heated by the hot atmosphere escaping through the opening 19*c*. The resist film coating modules 15 are never subject to adverse influences of the hot atmosphere escaping through the opening 19*c*, either.

The developing block 4 is disposed adjacent the resist film forming block 3 described above. As shown in FIG. 5, an atmosphere shielding partition 13 is formed also between the resist film forming block 3 and developing block 4. This partition 13 has, arranged vertically, two substrate rests PASS5 and PASS6 for transferring wafers W between the two blocks 3 and 4, and two water-cooled cooling plates WCP for cooling the wafers W in a general or broad way.

The developing block 4 will be described. The developing block 4 is a mechanism for developing exposed wafers W. Specifically, the developing block 4 includes developing modules 30 for developing exposed wafers W, heat-treating modules 31 for heat-treating the wafers W in relation to development, and the third main transport mechanism 10C for transferring the wafers W to and from the developing modules 30 and heat-treating modules 31.

As shown in FIG. 3, the developing modules 30 consist of five developing modules 30*a*–30*e* (hereafter referenced "30" where the individual developing modules are not distinguished) of the same construction arranged vertically. Each developing module 30 includes a spin chuck 32 for suction-supporting and spinning a wafer W in horizontal posture, and a nozzle 33 for supplying a developer to the wafer W held on the spin chuck 32.

As shown in FIG. 4, the heat-treating modules 31 include a plurality of heating plates HP, a plurality of heating modules PHP with temporary substrate deposits, and a plurality of cooling plates CP. As in the other blocks 2 and 3, these heat-treating modules are arranged vertically and in a plurality of columns. The right-hand column (adjacent the interface block 5) of heat-treating modules 31 includes substrate rests PASS7 and PASS8 arranged one over the other and close to each other for transferring wafers W to and from the interface block 5. The upper substrate rest PASS7 is used to feed wafers W and the lower substrate rest PASS8 to return wafers W.

The interface block 5 will be described. The interface block 5 is a mechanism for transferring wafers W to and from the exposing apparatus STP which is an external apparatus separate from the substrate treating apparatus. The interface block 5 in this embodiment includes, besides an interface's transport mechanism 35 for transferring wafers W to and from the exposing apparatus STP, two edge exposing modules EEW for exposing peripheries of wafers W coated with photoresist, and the fourth main transport mechanism 10D for transferring wafers W to and from the edge exposing modules EEW and the heat-treating modules PHP with temporary substrate deposits arranged in the developing block 4.

As shown in FIG. 3, each edge exposing module EEW includes a spin chuck 36 for suction-supporting and spinning a wafer W in horizontal posture, and a light emitter 37 for exposing peripheries the wafer W held on the spin chuck 36. The two edge exposing modules EEW are arranged one over the other in a middle position of the interface block 5. The fourth main transport mechanism 10D disposed adjacent the edge exposing modules EEW and the heat-treating modules of the developing block 4 has the same construction as the main transport mechanism 10 illustrated in FIGS. 7A and 7B.

Figure 6:
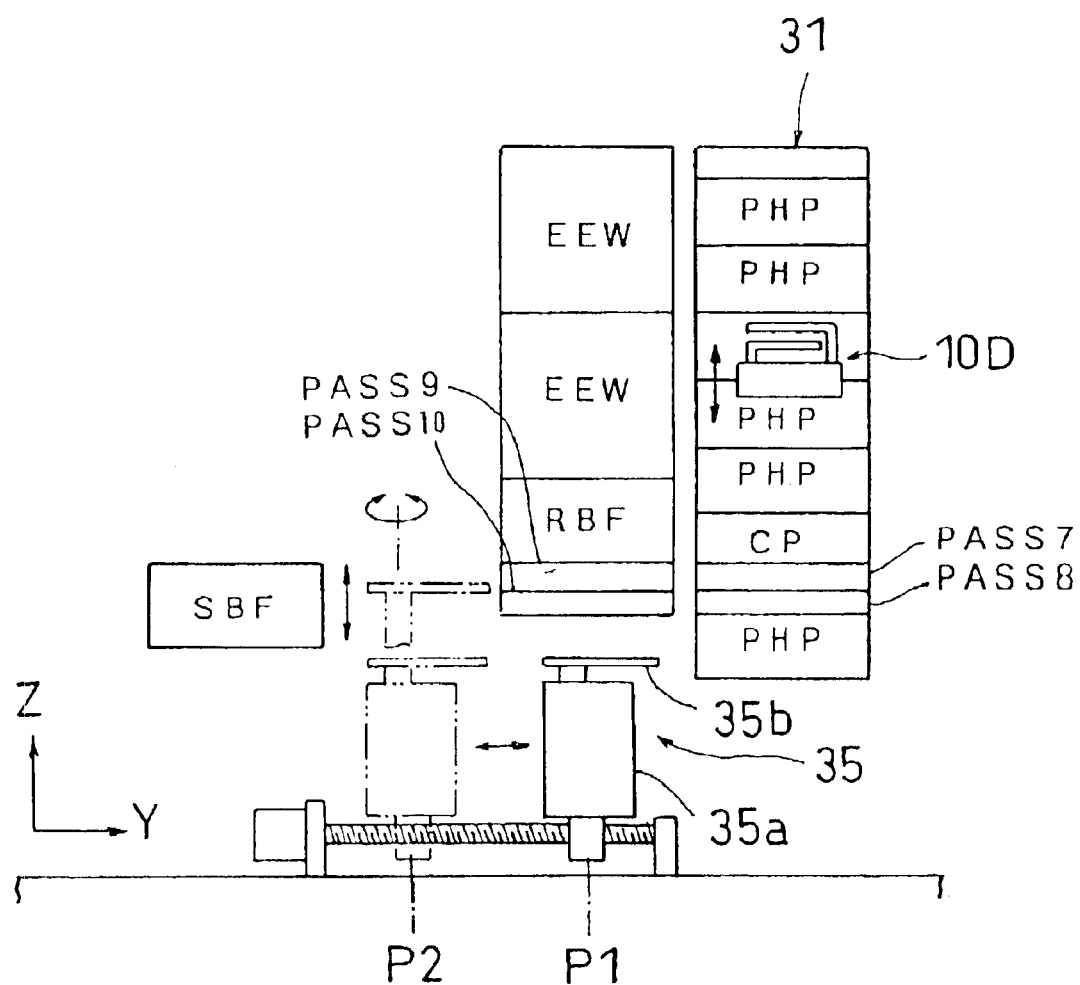
FIG. 6 is a side view showing an outline of an interface block.

Reference is made to FIGS. 3 and 6. FIG. 6 is a side view of the interface block 5. A substrate return buffer RBF is disposed below the two edge exposing modules EEW, and two substrate rests PASS9 and PASS10 are arranged one over the other, below the buffer RBF. The substrate return buffer RBF is provided for temporarily storing wafers W having undergone post-exposure heating treatment in the heating modules PHP of the developing block 4 when the developing block 4 cannot develop the wafers W due to some fault, for example. This buffer RBF is in the form of a storage rack for storing a plurality of wafers W in multiple stages. The substrate rests PASS9 and PASS10 are used for transferring wafers W between the fourth main transport mechanism 10D and interface's transport mechanism 35. The upper rest is for feeding wafers W, while the lower rest is for returning wafers W.

As shown in FIGS. 2 and 6, the interface's transport mechanism 35 has a movable base 35a for horizontal movement in Y-direction, and a holding arm 35b mounted on the movable base 35a for holding a wafer W. The holding arm 35b is vertically movable, swingable, and extendible and retractable radially of the swinging movement. The interface's transport mechanism 35 has one end (position P1 shown in FIG. 6) of its transport path extending under the substrate rests PASS9 and PASS10 arranged vertically. In the position P1, the interface's transport mechanism 35 transfers wafers W to and from the exposing apparatus STP. In the other end position P2 of the transport path, the interface's transport mechanism 35 transfers wafers W to and from the substrate rests PASS9 and PASS10, and deposits and fetch wafers W to/from a feed buffer SBF. The feed buffer SBF is provided for temporarily storing wafers W to be exposed, when the exposing apparatus STP cannot accept the wafers W, and is in the form of a storage rack for storing a plurality of wafers W in multiple stages.

The substrate treating apparatus having the above construction feeds downflows of clean air into the indexer block 1, respective treating blocks 2, 3 and 4 and interface block 5 to avoid adverse influences on the processes exerted by floating particles and air currents in these blocks. The interior of each block is maintained at a slightly higher pressure than external environment of the apparatus to prevent entry of particles, contaminants and the like from the external environment. The antireflection film forming block 2, in particular, is set to a higher atmospheric pressure than the indexer block 1. Since the atmosphere in the indexer block 1 does not flow into the antireflection film forming block 2, the treating processes may be carried out in the respective blocks 2, 3 and 4 without being influenced by external atmosphere.

A control system, particularly controls of substrate transport, of the substrate treating apparatus in this embodiment will be described next.

Figure 9A:
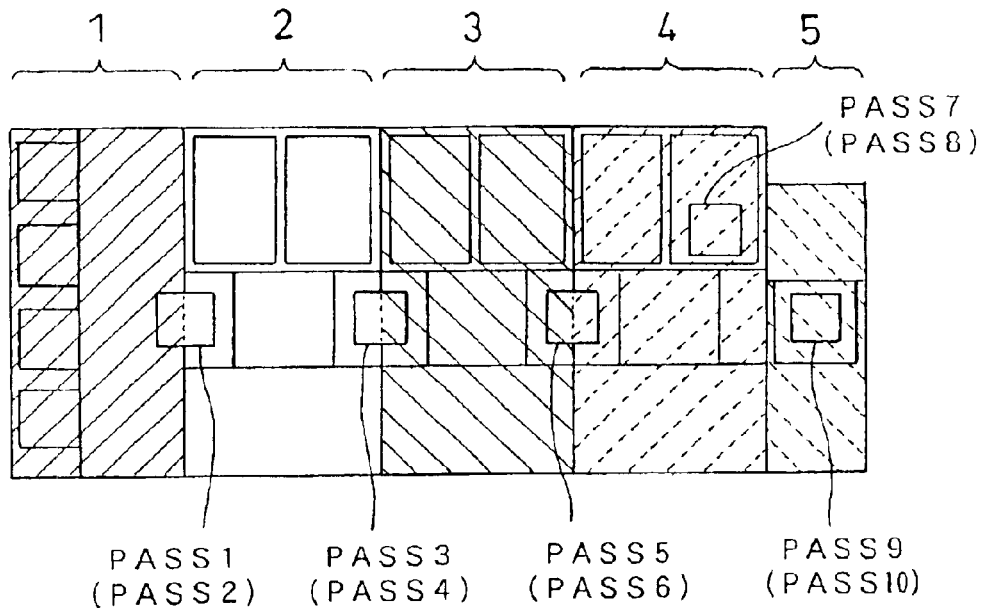
FIG. 9A is a plan view showing an arrangement of blocks in the apparatus according to the invention.

The indexer block 1, antireflection film forming block 2, resist film forming block 3, developing block 4 and interface block 5 described above are components resulting from a mechanical division of the substrate treating apparatus. Specifically, the substrate treating apparatus is formed by assembling the respective blocks to individual block frames and connecting the block frames together (see FIG. 9A).

On the other hand, as one of the features of this invention, controlled units relating to substrate transport are provided separately from the blocks constituting the mechanical components. That is, each single controlled unit includes treating modules for performing required treatment of substrates, and a single main transport mechanism for transferring the substrates to and from the treating modules. Such controlled units are juxtaposed to form the substrate treating apparatus. The main transport mechanisms of the respective controlled units transfer substrates through the substrate rests, and each controlled unit includes a control device for controlling at least the substrate transfer operation of the main transport mechanism of each controlled unit. The control device of each controlled unit performs, independently of the other control devices, a series of controls relating to substrate transport including transfer of substrates to and from the treating modules and transfer of substrates to and from the substrate rests.

Figure 9B:
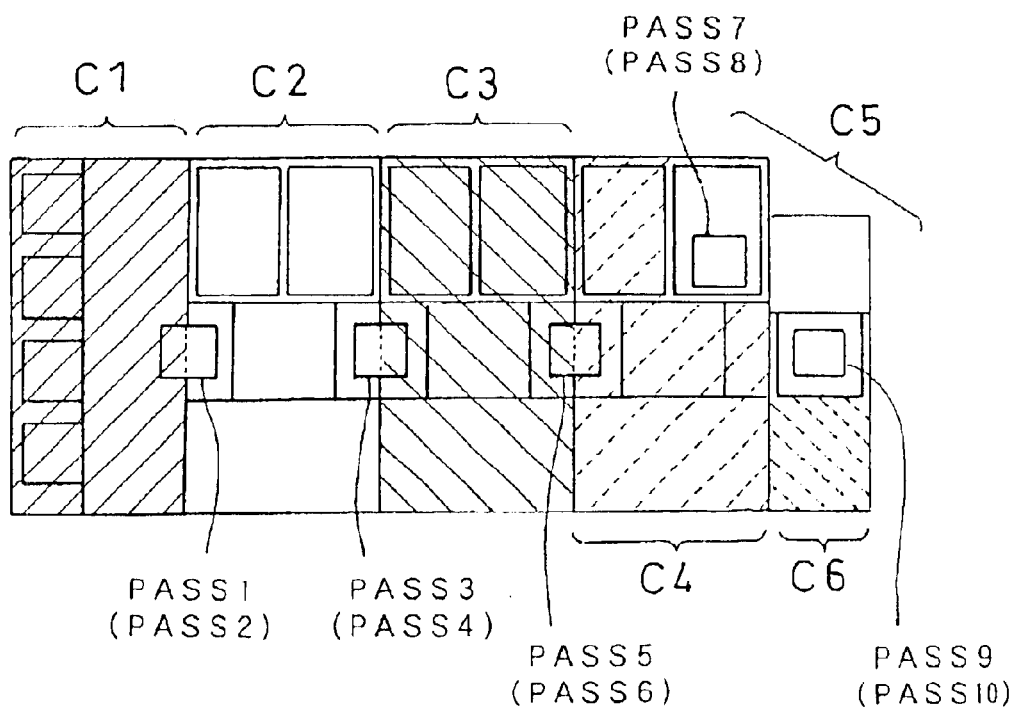
FIG. 9B is a plan view showing an arrangement of cells in the apparatus according to the invention.

The controlled units in this embodiment are hereinafter called "cells". FIG. 9B shows an arrangement of cells in this embodiment.

An indexer cell C1 includes the cassette table 6 and indexer's transport mechanism 7. Consequently, this cell C1 has the same construction as the indexer block 1 which is a component divided mechanically. An antireflection film forming cell C2 includes the antireflection film coating modules 8, antireflection film heat-treating modules 9 and first main transport mechanism 10A. Consequently, this cell C2 also has the same construction as the antireflection film forming block 2 which is a component divided mechanically. A resist film forming cell C3 includes the resist film coating modules 15, resist film heat-treating modules 16 and second main transport mechanism 10B. Consequently, this cell C3 also has the same construction as the resist film forming block 3 which is a component divided mechanically.

On the other hand, a developing cell C4 includes the developing modules 30, heat-treating modules 31 excluding the heat-treating modules (heating modules PHP in the embodiment) used for post-exposure heating, and the third main transport mechanism 10C. This cell C4 has a construction different from the developing block 4 which is a component divided mechanically, in excluding the heating modules PHP used for post-exposure heating.

A post-exposure heating cell C5 includes post-exposure heating modules (i.e. heating modules PHP arranged in the developing block 4 in the embodiment) for heating exposed wafers W before development, edge exposing modules EEW and fourth main transport mechanism 10D. This cell C5 bridges the developing block 4 and interface block 5 which are components divided mechanically, and is a characteristic cell of this embodiment. Since the post-exposure heating modules (i.e. heating modules PHP) and fourth main transport mechanism 10D are incorporated into the single cell as noted above, exposed wafers W may be loaded into the heating modules PHP promptly for heat treatment. This is advantageous where a chemically amplified photoresist is used which requires to be heated quickly after exposure.

An interface cell C6 includes the interface's transport mechanism 35 for transferring wafers W to and from the exposing apparatus STP which is an external apparatus. This cell C6 does not include the fourth main transport mechanism 10D or edge exposing modules EEW and, in this respect, is different from the interface block 5 which is a component divided mechanically.

This embodiment has the above six cells C1–C6 arranged in juxtaposition. Wafers W are transferred between the cells C1–C6 through the substrate rests PASS1–PASS10. In other words, each controlled unit (cell) in this invention includes a single main transport mechanism, and treating modules to and from which the main transport mechanism transfers wafers W received from a particular one of the substrate rests before placing the wafers W on the other substrate rest.

Figure 10A:
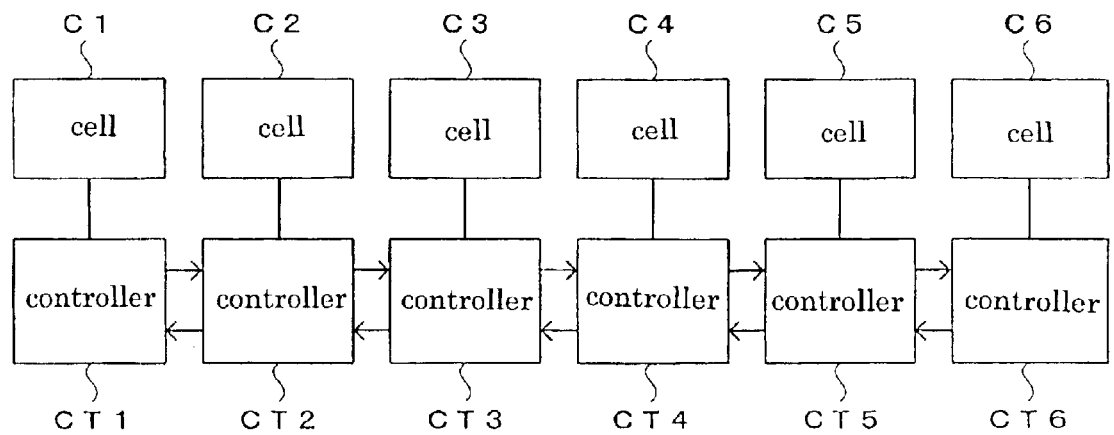
FIG. 10A is a block diagram of a control system in the apparatus according to the invention.

The cells C1–C6 individually include controllers CT1–CT6 for controlling at least substrate transfer operations of the main transport mechanisms (including the indexer's transport mechanism 7 and interface's transport mechanism 35), respectively. Each of the controllers CT1–CT6 independently performs a series of controls, starting with receipt of a wafer W from a predetermined substrate rest, and finishing with placement of the wafer W on a predetermined substrate rest. Specifically, as shown in FIG. 10A, the controllers CT1–CT6 of the respective cells C1–C6 exchange information in such a way that one controller sends information to the controller of a next cell that a wafer W has been placed on a predetermined substrate rest, and the controller of the next cell having received the wafer W returns information to the controller of the preceding cell that the wafer W has been received from the predetermined substrate rest.

Figure 10B:
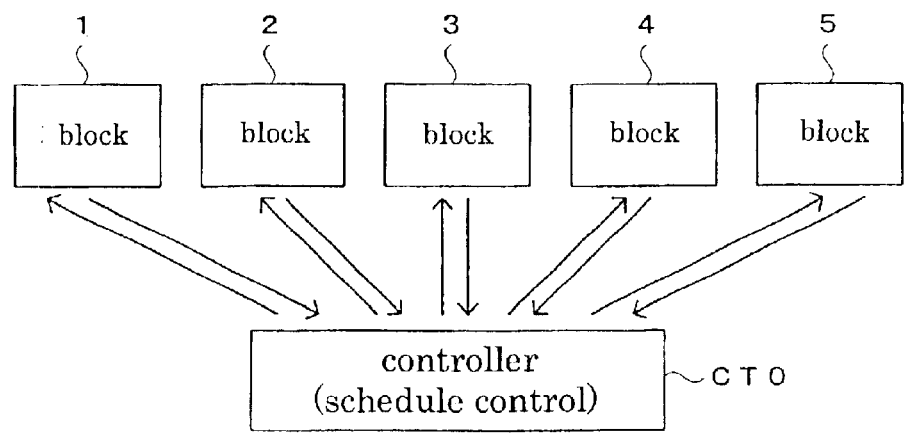
FIG. 10B is a block diagram of a control system in a conventional apparatus shown for comparison purposes.

That is, each of the controllers CT1–CT6 performs controls only for transfer of wafers W within its cell without regard to movement of the main transport mechanisms in the adjoining cells. Thus, the controllers CT1–CT6 operate under a reduced control load. In the control method in a conventional substrate treating apparatus, as shown in FIG. 10B, each of the blocks 1–5 transmits information relating to substrate transport to a controller CT0 for schedule management, and the controller CT0 performs an overall control of substrate transport. Thus, the controller CT0 has an increased load.

In this embodiment, the controllers CT1–CT6 operate under a reduced control load as described above, and thus the substrate treating apparatus has correspondingly improved throughput. In the conventional control method shown in FIG. 10B, a treating module newly added necessitates an extensive revision of the schedule management program in the controller CT0. In the control method according to this invention, a cell may be added easily since it will not influence the adjoining cells. A cell that can be added is not limited to a particularly type. For example, an inspecting cell may be added between the resist film forming cell C3 and developing cell C4 for inspecting the thickness of resist film formed on wafers W or for inspecting the line width of developed resist film. In this case, the inspecting cell, as do the other cells in this embodiment, includes substrate inspecting modules for inspecting substrates, and a main transport mechanism for transporting substrates to and from the inspecting modules. The substrates are transferred between the inspecting cell and adjacent cells through substrate rests.

Where the main transport mechanism transports a wafer W from a particular location to another location, as one step, in each of the antireflection film forming cell C2, resist film forming cell C3 and the developing cell C4, which are different controlled units for different chemical treatments, the first, second and third main transport mechanisms 10A, 10B and 10C in the cells C2, C3 and C4 perform substantially the same number of transport steps. This is another feature of the substrate treating apparatus in this embodiment. While its details will be apparent from the operation of the apparatus in this embodiment described hereinafter, as shown in FIG. 11, each of the above main transport mechanisms 10A, 10B and 10C performs approximately six transport steps.

In this embodiment, the main transport mechanism 10 carries out one transport step in about four seconds. Thus, with the main transport mechanism 10 performing six transport steps, each of the cells C2–C3 discharges one wafer W every 24 seconds (i.e. in a processing cycle of 24 seconds) to the adjoining cell. That is, this apparatus can process 150 wafers W per hour. If one main transport mechanism performs more transport steps than the other main transport mechanisms, the throughput of the substrate treating apparatus is dependent on the processing cycle of the cell to which that one main transport mechanism belongs. Where, for example, each of the main transport mechanisms 10A and 10C of the cells C2 and C4 performs five transport steps, and the main transport mechanism 10B of the cell C3 performs eight transport steps, wafers W flow between the cells C2–C4 only in the processing cycle of the cell C3 (which is 32 seconds in this case). Even if the main transport mechanisms 10A and 10C of cells C2 and C4 can afford to transport more wafers W, the substrate treating apparatus can process only 112.5 wafers W per hour.

In this embodiment, on the other hand, each of the main transport mechanisms 10A, 10B and 10C of the antireflection film forming cell C2, resist film forming cell C3 and developing cell C4 shares approximately the same number of transport steps. This embodiment avoids a situation where one main transport mechanism reaches the limit of transporting process earlier than the other main transport mechanisms. As a result, the substrate treating apparatus provides improved throughput.

Regarding the post-exposure heating cell C5 disposed adjacent the developing cell C4, the fourth main transport mechanism 10D of this cell C5 is set to perform five transport steps. The post-exposure heating cell C5 requires a strict management of time from exposure to heating of wafer W. Thus, from the viewpoint of allowing elbowroom, the fourth main transport mechanism 10D is given a lighter transport load than the other main transport mechanisms. Where no such elbowroom is required for the fourth main transport mechanism 10D, this heating cell C5 will have a margin for one transport step. This transport margin may be utilized for adding a new treating module, e.g. a module for inspecting wafers W, to the post-exposure heating cell C5. Even with such a substrate inspecting module added, the main transport mechanism 10D of the cell C5 shares only six transport steps as do the main transport mechanisms of the other cells. That is, even where a substrate inspecting module is added to the cell C5 having a transport margin, the cell C5 has the same processing cycle of 24 seconds as the other cells. This results in no reduction in the throughput of the substrate treating apparatus.

Operation of the substrate treating apparatus in this embodiment will be described next. See FIG. 11 particularly for the transport steps executed by the main transport mechanisms 10A–10D of the antireflection film forming cell C2, resist film forming cell C3, developing cell C4 and post-exposure heating cell C5.

First, the indexer's transport mechanism 7 of the indexer cell C1 (indexer block 1) moves horizontally to a position opposed to a predetermined cassette C. Then, a wafer W to be treated is fetched from the cassette C by vertically moving and extending and retracting the holding arm 7b. With the wafer W held by the holding arm 7b, the indexer's transport mechanism 7 moves horizontally to the position opposed to the substrate rests PASS1 and PASS2. Then, the transport mechanism 7 places the wafer W held by the holding arm 7b on the upper, substrate feeding rest PASS1. When a treated wafer W is found on the lower, substrate returning rest PASS2, the indexer's transport mechanism 7 loads the treated wafer W on the holding arm 7b, and deposits this treated wafer W in a predetermined cassette C. Subsequently, the transport mechanism 7 repeats the operation to fetch a wafer W to be treated from the cassette C, transport the wafer W to the substrate rest PASS1, receive a treated wafer W from the substrate rest PASS2, and deposit the treated wafer W in the cassette C.

Operation of the antireflection film forming cell C2 (antireflection film forming block 2) will be described. After the wafer W to be treated is placed on the substrate rest PASS1, as shown in FIG. 11, the first main transport mechanism 10A of the cell C2 vertically moves and swings the holding arms 10a and 10b together to the position opposed to the substrate rests PASS1 and PASS2. The first main transport mechanism 10A performs a wafer transfer operation to place a treated wafer W held by one holding arm 10b on the lower, substrate returning rest PASS2, and thereafter load the wafer W to be treated from the upper, substrate feeding rest PASS1 on the other holding arm 10a. Specifically, the holding arm 10b is advanced to place a treated wafer W on the substrate rest PASS2. The holding arm 10b having delivered the treated wafer W is retracted to the original position. Then, the holding arms 10a and 10b are slightly raised together, and thereafter the holding arm 10a is advanced to pick up the wafer W to be treated from the substrate rest PASS1. The holding arm 10a having received the wafer W is retracted to the original position.

The above transfer of the wafer W to be treated and the treated wafer W to and from the substrate rests PASS1 and PASS2 is indicated by a transport step (1+α) of the first main transport mechanism 10A in FIG. 11. Here, "α" represents the part of the transport step for slightly raising the holding arms 10a and 10b from the position opposed to the substrate rest PASS2 to the position opposed to the substrate rest PASS1 in order to receive the wafer W to be treated from the substrate rest PASS1. As noted hereinbefore, the substrate rests PASS1 and PASS2 are arranged vertically and close to each other. The time consumed in the movement between substrate rests PASS1 and PASS2 is brief and negligible. Thus, the transport step (1+α) may be regarded as one transport step (i.e. a substrate transfer operation carried out by the main transport mechanism within a predetermined time (e.g. four seconds) in this embodiment).

Upon completion of the transfer of wafers W to and from the substrate rests PASS1 and PASS2, the first main transport mechanism 10A vertically moves and swings together the holding arm 10a holding the wafer W to be treated and the unloaded holding arm 10b holding no wafer W to a position opposed to a predetermined cooling plate CP of the antireflection film heat-treating modules 9. Usually, a prior-treated wafer W is present on this cooling plate CP. Thus, the unloaded holding arm 10b is first advanced to pick up the cooled wafer W from the cooling plate CP. Then, the holding arm 10a holding the wafer W to be treated is advanced to place the wafer W to be treated on the cooling plate CP. The wafer W placed on the cooling plate CP is cooled to room temperature with high precision while the main transport mechanism 10A performs other transport operations. The transfer of wafers W to and from the cooling plate CP is carried out without vertically moving the two holding arms 10a and 10b. Thus, the transfer of wafers W to and from the cooling plate CP is carried out in one transport step of the first main transport mechanism 10A (see transport step (2) of the first main transport mechanism 10A shown in FIG. 11).

Upon completion of the transfer of wafers W to and from the cooling plate CP, the first main transport mechanism 10A vertically moves and swings together the unloaded holding arm 10a and the holding arm 10b holding the cooled wafer W to a position opposed to a predetermined one of the antireflection film coating modules 8. Usually, a prior-treated wafer W is present in this antireflection film coating module 8. Thus, the unloaded holding arm 10a is first advanced to pick up the treated wafer W from the spin chuck 11 in the antireflection film coating module 8. Then, the holding arm 10b holding the wafer W is advanced to place the wafer W on the spin chuck 11. The wafer W placed on the spin chuck 11 is coated with antireflection film while the main transport mechanism 10A performs other transport operations. The transfer of wafers W to and from the spin chuck 11 corresponds to transport step (3) of the first main transport mechanism 10A shown in FIG. 11. The "BARC" in FIG. 11 indicates the antireflection film coating module 8.

Upon completion of the transfer of wafers W to and from the spin chuck 11, the first main transport mechanism 10A vertically moves and swings together the holding arm 10a holding the wafer W coated with antireflection film and the holding arm 10b holding no wafer W to a position opposed to a predetermined heating plate HP. Usually, a prior-treated wafer W is present also on this heating plate HP. Thus, the unloaded holding arm 10b is first advanced to pick up the heated wafer W from the heating plate HP. Then, the holding arm 10a is advanced to place the wafer W to be treated on the heating plate HP. The wafer W placed on the heating plate HP is heat-treated to have superfluous solvent removed from the antireflection film on the wafer W while the main transport mechanism 10A performs other transport operations. The transfer of wafers W to and from the heating plate HP corresponds to transport step (4) of the first main transport mechanism 10A shown in FIG. 11.

Upon completion of the transfer of wafers W to and from the heating plate HP, the first main transport mechanism 10A vertically moves and swings together the unloaded holding arm 10a and the holding arm 10b holding the heated wafer W to a position opposed to one of the water-cooled cooling plates WCP installed on the partition 13. As in the cases noted above, the unloaded holding arm 10a is first advanced to pick up a treated wafer W from the cooling plate WCP. Then, the holding arm 10b is advanced to place the wafer W on the cooling plate WCP. The wafer W placed on the cooling plate WCP is roughly cooled while the main transport mechanism 10A performs other transport operations. The transfer of wafers W to and from the cooling plate WCP corresponds to transport step (5) of the first main transport mechanism 10A shown in FIG. 11.

Upon completion of the transfer of wafers W to and from the cooling plate WCP, the first main transport mechanism 10A raises together the holding arm 10a holding the roughly cooled wafer W and the unloaded holding arm 10b to a position opposed to the substrate rests PASS3 and PASS4 arranged above the cooling plates WCP. The holding arm 10a is advanced to place the wafer W on the upper, substrate feeding rest PASS3. Usually, the lower, substrate returning rest PASS4 is holding a developed wafer W sent thereto from the developing cell C4 through the resist film forming cell C3. After slightly lowering the holding arms 10*a* and 10*b*, the holding arm 10*b* is advanced to pick up the developed wafer W from the substrate rest PASS4.

The transfer of wafers W to and from the substrate rests PASS3 and PASS4 corresponds to the transport step (6+α) of the first main transport mechanism 10A shown in FIG. 11. As noted hereinbefore, "a" represents the brief part of the transport step for slightly raising and lowering the holding arms 10*a* and 10*b*. Thus, the transport step (6+α) may be regarded as one transport step.

The first main transport mechanism 10A of the antireflection film forming cell C2 repeats the transport step (1+α) through transport step (6+α) described above. A total of the transport step (1+α) through transport step (6+α) makes approximately six transport steps of the first main transport mechanism 10A. Assuming that one transport step takes four seconds, the first main transport mechanism 10A completes one cycle of substrate transport in about 24 seconds. In other words, the antireflection film forming cell C2 feeds one wafer W every 24 seconds (i.e. 150 wafers per hour) to the next, resist film forming cell C3.

Operation of the resist film forming cell C3 (resist film forming block 3) will be described. After the wafer W coated with antireflection film is placed on the substrate rest PASS3, as shown in FIG. 11, the second main transport mechanism 10B of cell C3 places a developed wafer W held by one holding arm 10*b* on the substrate rest PASS4. Then, the second main transport mechanism 10B loads the wafer W from substrate rest PASS3 on the holding arm 10*a*. The transfer of wafers W to and from the substrate rests PASS3 and PASS4 is indicated by transport step (1+α) of the second main transport mechanism 10B in FIG. 11. As noted hereinbefore, "α" represents a negligible time, and the transport step (1+α) may be regarded as one transport step.

Upon completion of the transfer of wafers W to and from the substrate rests PASS3 and PASS4, the second main transport mechanism 10B moves the holding arm 10*a* holding the wafer W and the holding arm 10*b* holding no wafer W to a position opposed to a predetermined cooling plate CP of the resist film heat-treating modules 16. The unloaded holding arm 10*b* is first advanced to pick up a cooled wafer W from the cooling plate CP. Then, the holding arm 10*a* is advanced to place the wafer W to be treated on the cooling plate CP. The transfer of wafers W to and from the cooling plate CP corresponds to transport step (2) of the second main transport mechanism 10B shown in FIG. 11.

Upon completion of the transfer of wafers W to and from the cooling plate CP, the second main transport mechanism 10B moves the unloaded holding arm 10*a* and the holding arm 10*b* holding the cooled wafer W to a position opposed to a predetermined one of the resist film coating modules 15. The unloaded holding arm 10*a* is first advanced to pick up a treated wafer W from the spin chuck 17 in the resist film coating module 15. Then, the holding arm 10*b* holding the wafer W is advanced to place the wafer W on the spin chuck 17. The wafer W placed on the spin chuck 17 is coated with resist film while the main transport mechanism 10B performs other transport operations. The transfer of wafers W to and from the spin chuck 17 corresponds to transport step (3) of the second main transport mechanism 10B shown in FIG. 11. The "PR" in FIG. 11 indicates the resist film coating module 8.

Upon completion of the transfer of wafers W to and from the spin chuck 17, the second main transport mechanism 10B moves the holding arm 10*a* holding the wafer W coated with resist film and the holding arm 10*b* holding no wafer W to a position opposed to a predetermined heating module PHP with temporary substrate deposit 19. The unloaded holding arm 10*b* is first advanced to pick up a treated wafer W from the temporary substrate deposit 19 of the heating module PHP. Then, the holding arm 10*a* is advanced to place the wafer W to be treated on the temporary substrate deposit 19. While the main transport mechanism 10B performs other transport operations, the local transport mechanism 20 transfers the wafer W placed on the temporary substrate deposit 19 to the heating plate HP in the heating module PHP for heat treatment. The wafer W heat-treated on the heating plate HP is returned to the temporary substrate deposit 19 by the same local transport mechanism 20. While being returned to the temporary substrate deposit 19 as held by the holding plate 24 of the local transport mechanism 20, the wafer W is cooled by the cooling mechanism in the holding plate 24. The transfer of wafers W to and from the heating module PHP corresponds to transport step (4) of the second main transport mechanism 10B shown in FIG. 11.

Upon completion of the transfer of wafers W to and from the heating module PHP, the second main transport mechanism 10B moves the unloaded holding arm 10*a* and the holding arm 10*b* holding the heated wafer W to a position opposed to a cooling plate CP of the resist film heat-treating modules 16. The unloaded holding arm 10*a* is advanced to pick up a cooled wafer W from the cooling plate CP. Then, the holding arm 10*b* is advanced to place the wafer W to be treated on the cooling plate CP. The transfer of wafers W to and from the cooling plate CP corresponds to transport step (5) of the second main transport mechanism 10B shown in FIG. 11.

Upon completion of the transfer of wafers W to and from the cooling plate CP, the second main transport mechanism 10B moves the holding arm 10*a* holding the cooled wafer W and the unloaded holding arm 10*b* to a position opposed to the substrate rests PASS5 and PASS6. The holding arm 10*a* is advanced to place the wafer W on the upper, substrate feeding rest PASS5, and the holding arm 10*b* is advanced to pick up a developed wafer W from the lower, substrate returning rest PASS6.

The transfer of wafers W to and from the substrate rests PASS5 and PASS6 corresponds to the transport step (6+α) of the second main transport mechanism 10B shown in FIG. 11. The transport step (6+α) is regarded as one transport step.

The second main transport mechanism 10B of the resist film forming cell C3 repeats the transport step (1+α) through transport step (6+α) described above. A total of the transport step (6+α) through transport step (1+α) makes approximately six transport steps of the second main transport mechanism 10B as in the case of the first main transport mechanism 10A. Thus, the second main transport mechanism 10B completes the same one cycle of substrate transport (in about 24 seconds in this embodiment) as does the first main transport mechanism 10A. In other words, the resist film forming cell C3 feeds one wafer W every 24 seconds (i.e. 150 wafers per hour) to the next, developing cell C4.

Operation of the developing cell C4 will be described. After the wafer W coated with resist film is placed on the substrate rest PASS5, as shown in FIG. 11, the third main transport mechanism 10C of cell C4 places a developed wafer W held by one holding arm 10*b* on the substrate rest PASS6. Then, the third main transport mechanism 10C loads the wafer W from the substrate rest PASS5 on the holding arm 10*a*. The transfer of wafers W to and from the substrate rests PASS5 and PASS6 is indicated by transport step (1+α) of the third main transport mechanism 10C in FIG. 11.

Upon completion of the transfer of wafers W to and from the substrate rests PASS5 and PASS6, the third main transport mechanism 10C moves the holding arm 10a holding the wafer W and the holding arm 10b holding no wafer W to a position opposed to the substrate rests PASS7 and PASS8 included in the vertical arrangement of heat-treating modules 31. The holding arm 10a is advanced to place the wafer W coated with resist film on the upper, substrate feeding rest PASS7. Then, the holding arm 10b is advanced to pick up a wafer W having undergone post-exposure heating treatment from the lower, substrate returning rest PASS8. The transfer of wafers W to and from the substrate rests PASS7 and PASS8 is indicated by transport step (2+α) of the third main transport mechanism 10C shown in FIG. 11.

Upon completion of the transfer of wafers W to and from the substrate rests PASS7 and PASS8, the third main transport mechanism 10C moves the unloaded holding arm 10a and the holding arm 10b holding the exposed and heat-treated wafer W to a position opposed to a predetermined cooling plate CP of the heat-treating modules 31. The unloaded holding arm 10a is first advanced to pick up a cooled wafer W from the cooling plate CP. Then, the holding arm 10b is advanced to place the wafer W to be treated on the cooling plate CP. The transfer of wafers W to and from the cooling plate CP corresponds to transport step (3) of the third main transport mechanism 10C shown in FIG. 11.

Upon completion of the transfer of wafers W to and from the cooling plate CP, the third main transport mechanism 10C moves the holding arm 10a holding the cooled wafer W and the unloaded holding arm 10b to a position opposed to a predetermined one of the developing modules 30. The unloaded holding arm 10b is first advanced to pick up a treated wafer W from the spin chuck 32 in the developing module 30. Then, the holding arm 10a holding the wafer W is advanced to place the wafer W on the spin chuck 32. The wafer W placed on the spin chuck 32 is developed while the main transport mechanism 10C performs other transport operations. The transfer of wafers W to and from the spin chuck 32 corresponds to transport step (4) of the third main transport mechanism 10C shown in FIG. 11. The "SD" in FIG. 11 indicates the developing module 8.

Upon completion of the transfer of wafers W to and from the spin chuck 32, the third main transport mechanism 10C moves the unloaded holding arm 10a and the holding arm 10b holding the developed wafer W to a position opposed to a predetermined heating plate HP of the developing modules 31. The unloaded holding arm 10a is first advanced to pick up a treated wafer W from the heating plate HP. Then, the holding arm 10b is advanced to place the wafer W to be treated on the heating plate HP. The transfer of wafers W to and from the heating plate HP corresponds to transport step (5) of the third main transport mechanism 10C shown in FIG. 11.

Upon completion of the transfer of wafers W to and from the heating plate HP, the third main transport mechanism 10C moves the holding arm 10a holding the heated wafer W and the unloaded holding arm 10b to a position opposed to the water-cooled cooling plates WCP installed on the partition 13 adjacent the resist film forming cell C3. The unloaded holding arm 10b is advanced to pick up a treated wafer W from the cooling plate WCP, and the holding arm 10a is advanced to place the wafer W to be treated on the cooling plate WCP. The transfer of wafers W to and from the cooling plate WCP corresponds to transport step (6) of the third main transport mechanism 10C shown in FIG. 11.

The third main transport mechanism 10C of the developing cell C4 repeats the transport step (1+α) through transport step (6) described above. A total of the transport step (1+α) through transport step (6) makes approximately six transport steps of the third main transport mechanism 10C as in the case of the first and second main transport mechanisms 10A and 10B. Thus, the third main transport mechanism 10C completes the same one cycle of substrate transport (in about 24 seconds in this embodiment) as do the first and second main transport mechanisms 10A and 10B. In other words, the developing cell C4 feeds one wafer W every 24 seconds (i.e. 150 wafers per hour) to the next, post-exposure heating cell C5.

Operation of the post-exposure heating cell C5 will be described. After the wafer W coated with resist film is placed on the substrate rest PASS7, as shown in FIG. 11, the fourth main transport mechanism 10D of cell C5 places a developed and heated wafer W held by the holding arm 10b on the substrate rest PASS8. Then, the fourth main transport mechanism 10D loads the wafer W from the substrate rest PASS7 on the holding arm 10a. The transfer of wafers W to and from the substrate rests PASS7 and PASS8 is indicated by transport step (1+α) of the fourth main transport mechanism 10D in FIG. 11.

Upon completion of the transfer of wafers W to and from the substrate rests PASS7 and PASS8, the fourth main transport mechanism 10D moves the holding arm 10a holding the wafer W and the holding arm 10b holding no wafer W to a position opposed to a predetermined one of the edge exposing modules EEW. The unloaded holding arm 10b is first advanced to pick up an edge-exposed wafer W from the spin chuck 36 in the edge exposing module EEW. Then, the holding arm 10a holding the wafer W is advanced to place the wafer W to be treated on the spin chuck 36. The wafer W placed on the spin chuck 36 has peripheries thereof exposed while the main transport mechanism 10D performs other transport operations. The transfer of wafers W to and from the spin chuck 36 corresponds to transport step (2) of the fourth main transport mechanism 10D shown in FIG. 11.

Upon completion of the transfer of wafers W to and from the spin chuck 36, the fourth main transport mechanism 10D moves the unloaded holding arm 10a and the holding arm 10b holding the edge-exposed wafer W to a position opposed to a predetermined cooling plate CP of the heat-treating modules 31. The unloaded holding arm 10a is advanced to pick up a cooled wafer W from the cooling plate CP, and the holding arm 10b is advanced to place the edge-exposed wafer W on the cooling plate CP. The transfer of wafers W to and from the cooling plate CP corresponds to transport step (3) of the fourth main transport mechanism 10D shown in FIG. 11.

Upon completion of the transfer of wafers W to and from the cooling plate CP, the fourth main transport mechanism 10D moves the holding arm 10a holding the cooled wafer W and the unloaded holding arm 10b to a position opposed to the substrate rests PASS9 and PASS10. Then, the holding arm 10a is advanced to place the wafer W on the upper, substrate feeding rest PASS9, and the holding arm 10b is advanced to pick up a wafer W exposed in the exposing apparatus STP from the lower, substrate returning rest PASS10. The transfer of wafers W to and from the substrate rests PASS9 and PASS10 corresponds to transport step (4+α) of the fourth main transport mechanism 10D shown in FIG. 11.

Upon completion of the transfer of wafers W to and from the substrate rests PASS9 and PASS10, the fourth main transport mechanism 10D moves the unloaded holding arm 10a and the holding arm 10b holding the exposed wafer W to a position opposed to a predetermined heating module PHP, with a temporary substrate deposit, of the heat-treating modules 31. The unloaded holding arm 10a is first advanced to pick up an exposed and heated wafer W from the heating module PHP (more particularly from the temporary substrate deposit 19). Then, the holding arm 10b is advanced to place the exposed wafer W in the heating module PHP (more particularly in the temporary substrate deposit 19). While the main transport mechanism 10D performs other transport operations, the local transport mechanism 20 transfers the wafer W placed on the temporary substrate deposit 19 to the heating plate HP for heat treatment. Subsequently, the heated wafer W is returned to the temporary substrate deposit 19 by the same local transport mechanism 20. The transfer of wafers W to and from the heating module PHP corresponds to transport step (5) of the fourth main transport mechanism 10D shown in FIG. 11.

The fourth main transport mechanism 10D of the post-exposure heating cell C5 repeats the transport step (1+α) through transport step (5) described above. A total of the transport step (1+α) through transport step (5) makes approximately five transport steps of the fourth main transport mechanism 10D, which are one less than the transport steps shared by the first to third main transport mechanisms 10A–10C. In the post-exposure heating cell C5 only, the fourth main transport mechanism 10D is operable in cycles of 20 seconds when one transport step takes four seconds. However, since the other, first to third main transport mechanisms 10A–10C operate in cycles of 24 seconds, the post-exposure heating cell C5, after all, feeds one wafer W every 24 seconds (i.e. 150 wafers per hour) to the next, interface cell C6, i.e. at the same rate as the other cells.

Operation of the interface cell C6 will be described. After the edge-exposed wafer W is placed on the substrate rest PASS9, the transport mechanism 35 of the interface cell C6 receives the wafer W from the substrate rest PASS9, and passes the wafer W on to the adjoining exposing apparatus STP. Furthermore, the interface's transport mechanism 35 receives an exposed wafer W from the exposing apparatus STP, and places this wafer W on the substrate returning rest PASS10. The interface's transport mechanism 35 repeats this substrate transport operation.

In the substrate treating apparatus in this embodiment, as described above, the respective cells C1–C6 transport wafers W, under control of the controllers CT1–CT6, by using the main transport mechanisms 10 (however, the indexer cell C1 uses the indexer's transport mechanism 7, and the interface cell C6 the interface's transport mechanism 35). The two adjoining cells exchange information on substrate transport, only indicating that a wafer has been placed on a substrate rest PASS, and that a wafer W has been received. That is, each cell performs substrate transport within itself and independently without monitoring states of substrate transport in the adjoining cells. Thus, the cells do not necessarily deliver wafers W at the same time, but with certain time lags. However, such time lags are absorbed by varied lengths of time for which the wafers W are kept on the substrate rests provided for transferring the wafers W between the adjoining cells. The time lags in the substrate transfer between the adjoining cells never impede the substrate transport.

According to this embodiment, therefore, the controllers CT1–CT6 have a reduced load of controlling the cells C1–C6, whereby the substrate treating apparatus provides a correspondingly improved throughput, and has a correspondingly simplified construction. A substrate inspecting cell including substrate inspecting modules and a main transport mechanism may easily be installed between appropriate cells, which renders the substrate treating apparatus highly flexible. Further, where the apparatus includes a cell of less transport steps than the other cells (the post-exposure heating cell C5 in this embodiment), new treating modules (e.g. substrate inspecting modules) may easily be added to this cell without affecting the other cells.

The exposing apparatus STP or developing cell C4 may become incapable of accepting wafers W due to some fault. Operation on such an occasion will be described nest.

Assume that the exposing apparatus STP has become incapable of accepting wafers W. In this case, the transport mechanism 35 of the interface cell C6 picks up wafers W from the substrate rest PASS9, and temporarily stores these wafers W in the feed buffer SBF. Treatment is continued only for the number of wafers W stored in the buffer SBF. When the buffer SBF is expected to accommodate no more wafers W, the operation for fetching wafers W from the indexer cell C1 is stopped. When the exposing apparatus STP has become ready to accept wafers W, the interface's transport mechanism 35 fetches the wafers W from the buffer SBF in the order in which the wafers W were stored, and passes the wafers W to the exposing apparatus STP. Thereafter the apparatus resumes normal operations.

Assume that the developing cell C4 has become incapable of accepting wafers W. In this case, the interface's transport mechanism 35 passes exposed wafers W successively returned from the exposing apparatus STP to the substrate rest PASS10 as usual. The fourth main transport mechanism 10D of the post-exposure heating cell C5 passes the exposed wafers W to the heating modules PHP as usual. The fourth main transport mechanism 10D temporarily stores the wafers W having undergone the post-exposure heat treatment in the heating modules PHP, in the substrate return buffer RBF in the cell C5, instead of placing these wafers W on the substrate rest PASS8. Similar post-exposure heating is carried out for the number of wafers W already loaded into the exposing apparatus STP, and these wafers W are thereafter stored in the substrate return buffer RBF. When the developing cell C4 has become ready to accept wafers W, the fourth main transport mechanism 10D fetches the wafers W from the buffer RBF in the order in which the wafers W were stored, and passes the wafers W to the substrate rest PASS8. Thereafter the apparatus resumes normal operations.

In the apparatus described above, the substrate return buffer RBF is provided in the post-exposure heating cell C5 for storing wafers W returned from the exposing apparatus STP and heated in the heating modules PHP. Thus, the wafers W returned from the exposing apparatus STP are never left untreated for a long time, without receiving post-exposure heating treatment. The conventional substrate treating apparatus has a feed buffer and a return buffer installed in the same location, and the interface's transport mechanism stores wafers W returned from the exposing apparatus directly in the return buffer. Thus, the wafers W returned from the exposing apparatus are left untreated for a long time.

A chemistry amplified photoresist needs to be heated promptly after exposure. With the above storage method used in the conventional apparatus, even if substrates are stored in the return buffer, the quality of resist film lowers after all. This poses a problem of having to separate the resist film for reclaiming treatment. By contrast, the apparatus in this embodiment promptly heats the wafers W returned from the exposing apparatus STP, and thereafter stores the wafers W in the buffer RBF. This maintains the quality of photoresist film, and dispenses with the reclaiming treatment required by the conventional apparatus.

This invention is not limited to the embodiment described above, but may be modified as follows:

(1) In the foregoing embodiment, the first to fourth main transport mechanisms 10A–10D do not move horizontally, but only their holding arms are constructed vertically movable, swingable, and extendible and retractable. However, these main transport mechanisms 10A–10D may be adapted horizontally movable.

(2) The first to fourth main transport mechanisms 10A–10D each include two holding arms 10a and 10b. Instead, each may have a single holding arm.

(3) In the foregoing embodiment, the post-exposure heating cell C5 bridges the developing block 4 and interface block 5. The post-exposure heating cell C5 may be provided as an independent block (component assembled to its own block frame).

(4) In the foregoing embodiment, the antireflection film forming block 2 and resist film forming block 3 are provided individually. Instead, a single treating block may be provided for performing antireflection film forming treatment and resist film forming treatment. Where the application of antireflection film is unnecessary, the antireflection film formation block 2 may be omitted.

This invention may be embodied in other specific forms without departing from the spirit or essential attributes thereof and, accordingly, reference should be made to the appended claims, rather than to the foregoing specification, as indicating the scope of the invention.

What is claimed is:

1. A substrate treating apparatus for performing a series of chemical treatments and heat treatments on substrates, comprising:

a plurality of treating blocks arranged in juxtaposition, each for performing a respective chemical treatment;

each of said treating blocks including a chemical treating module for performing said respective chemical treatment, a heat-treating module for performing heat treatment relating to said respective chemical treatment, and a single main transport mechanism for transporting the substrates between said chemical treating modules and said heat-treating modules;

wherein said main transport mechanism of each treating block transfers the substrates to an adjacent one of the treating blocks via a substrate rest provided for receiving the substrates to be transferred; and wherein said substrate rest includes at least two substrate rests, i.e. a substrate feeding rest for feeding the substrates from one of the treating blocks, and a substrate returning rest for returning the substrates to said one of the treating blocks.

2. A substrate treating apparatus as defined in claim 1, wherein said main transport mechanism of each treating block shares a substantially equal number of transport steps, where one transport step is a step of transporting each substrate from a particular position to a different position.

3. A substrate treating apparatus as defined in claim 1, wherein said substrate feeding rest and substrate returning rest are arranged vertically and close to each other.

4. A substrate treating apparatus as defined in claim 1, wherein said treating blocks are divided by a partition, said substrate rest extending partially through said partition.

5. A substrate treating apparatus as defined in claim 1, wherein said substrate rest includes a sensor for detecting the substrates.

6. A substrate treating apparatus as defined in claim 1, wherein said chemical treating module and said heat-treating module are opposed to each other across said main transport mechanism.

7. A substrate treating apparatus as defined in claim 6, wherein each treating block includes a plurality of chemical treating modules arranged vertically, and a plurality of heat-treating modules arranged vertically.

8. A substrate treating apparatus as defined in claim 7, wherein said heat-treating modules are arranged vertically in a plurality of columns erected side by side.

9. A substrate treating apparatus for performing a series of chemical treatments and heat treatments on substrates, comprising:

a plurality of treating blocks arranged in juxtaposition, each for performing a respective chemical treatment;

each of said treating blocks including a chemical treating module for performing said respective chemical treatment, a heat-treating module for performing heat treatment relating to said respective chemical treatment, and a single main transport mechanism for transporting the substrates between said chemical treating modules and said heat-treating modules;

wherein said heat-treating module includes a heat-treating module with a temporary substrate deposit, having a heating plate for supporting and heating a substrate, the temporary substrate deposit for holding the substrate in an upper or lower position away from said heating plate, and a local transport mechanism for transporting the substrate between said heating plate and said temporary substrate deposit.

10. A substrate treating apparatus as defined in claim 9, wherein said local transport mechanism includes cooling means for cooling the substrate while transporting the substrate from said heating plate to said temporary substrate deposit.

11. A substrate treating apparatus as defined in claim 9, wherein said main transport mechanism transfers the substrate to and from said temporary substrate deposit.

12. A substrate treating apparatus as defined in claim 9, wherein at least said heating plate is enclosed in a housing defining an opening for allowing said local transport mechanism to load and unload the substrate on/from said heating plate, said opening being located in a side remote from a side accessed by said main transport mechanism.

13. A substrate treating apparatus for performing a series of chemical treatments and heat treatments on substrates, comprising:

an indexer block including a cassette table for receiving a plurality of cassettes each for containing a plurality of substrates in multiple stages, and an indexer's transport mechanism for successively fetching substrates to be treated from each cassette, and successively depositing treated substrates in each cassette;

an antireflection film forming block disposed adjacent said indexer block, and including antireflection film coating modules for coating antireflection film on surfaces of substrates, antireflection film heat-treating modules for heat-treating the substrates in relation to antireflection film coating, and a first main transport mechanism for transferring the substrates to and from said antireflection film coating modules and said antireflection film heat-treating modules;

a resist film forming block disposed adjacent said antireflection film forming block, and including resist film coating modules for coating photoresist film on the substrates having the antireflection film formed thereon, resist film heat-treating modules for heat-treating the substrates in relation to photoresist film coating, and a second main transport mechanism for transferring the substrates to and from said resist film coating modules and said resist film heat-treating modules;

a developing block disposed adjacent said resist film forming block, and including developing modules for developing the substrates having the photoresist film formed thereon and exposed, heat-treating modules for development for heat-treating the substrates in relation to development, and a third main transport mechanism for transferring the substrates to and from said developing modules and said heat-treating modules for development; and an interface block disposed adjacent said developing block and including an interface's transport mechanism for transferring the substrates to and from an exposing apparatus provided separately from and externally of the substrate treating apparatus.

14. A substrate treating apparatus as defined in claim 13, wherein at least said indexer block and said antireflection film forming block are divided by a partition defining an opening for allowing substrate transfer, and said antireflection film forming block has a higher atmospheric pressure than said indexer block.

15. A substrate treating apparatus as defined in claim 13, wherein:

said heat-treating modules of said developing block include heat-treating modules with temporary substrate deposits, each having a heating plate for supporting and heating a substrate, a temporary substrate deposit for holding the substrate in an upper or lower position away from said heating plate, and a local transport mechanism for transporting the substrate between said heating plate and said temporary substrate deposit; and said interface block further includes edge exposing modules for exposing peripheries of the substrates coated with photoresist, and a fourth main transport mechanism for transferring wafers the substrates to and from said heat-treating modules with temporary substrate deposits and said edge exposing modules.

16. A substrate treating apparatus as defined in claim 15, wherein said local transport mechanism includes cooling means for cooling the substrate while transporting the substrate from said heating plate to said temporary substrate deposit.

17. A substrate treating apparatus as defined in claim 13, wherein:

said indexer's transport mechanism and said first main transport mechanism transfer the substrates to each other through a substrate rest provided for receiving the substrates to be transferred; and said first main transport mechanism and said second main transport mechanism, said second main transport mechanism and said third main transport mechanism, said third main transport mechanism and said fourth main transport mechanism, and said fourth main transport mechanism and said interface's transport mechanism transfer the substrates to each other through substrate rests provided for receiving the substrates to be transferred.

18. A substrate treating apparatus as defined in claim 13, wherein:

said interface block further includes a feed buffer for temporarily storing substrates to be exposed, when said exposing apparatus cannot accept the substrates, and a substrate return buffer for temporarily storing substrates to be developed, when exposed substrates cannot be developed;

said interface's transport mechanism deposits the substrates to be exposed in said feed buffer when the exposing apparatus cannot accept the substrates; and said fourth transport mechanism deposits the substrates to be developed in said return buffer, after the substrates to be developed are heat-treated in said heat-treating modules with temporary substrate deposits of said developing block, when the exposed substrates cannot be developed.

19. A substrate treating apparatus comprising a plurality of controlled units arranged in juxtaposition, each including treating modules for performing required treatment of substrates, and a single main transport mechanism for transporting to and from said treating modules, wherein:

the main transport mechanisms of said controlled units transfer the substrates to each other through a substrate rest provided for receiving the substrates to be transferred;

each of said controlled units has control means for controlling at least a substrate transfer operation of the main transport mechanism of each said controlled unit; and said control means of each said controlled unit is independently operable to control a series of substrate transport steps including transfer of the substrates to and from said treating modules and transfer of the substrates to and from said substrate rest.

20. A substrate treating apparatus as defined in claim 19, wherein:

one of said controlled units is in form of an indexer block including a cassette table for receiving a plurality of cassettes each for containing a plurality of substrates in multiple stages, and an indexer's transport mechanism for successively fetching substrates to be treated from each cassette, and successively depositing treated substrates in each cassette;

a second one of said controlled units is in form of an antireflection film forming block including antireflection film coating modules for coating antireflection film on surfaces of substrates, antireflection film heat-treating modules for heat-treating the substrates in relation to antireflection film coating, and a first main transport mechanism for transferring the substrates to and from said antireflection film coating modules and said antireflection film heat-treating modules;

a third one of said controlled units is in form of a resist film forming block including resist film coating modules for coating photoresist film on the substrates having the antireflection film formed thereon, resist film heat-treating modules for heat-treating the substrates in relation to photoresist film coating, and a second main transport mechanism for transferring the substrates to and from said resist film coating modules and said resist film heat-treating modules;

a fourth one of said controlled units is in form of a developing block including developing modules for developing the substrates having the photoresist film formed thereon and exposed, heat-treating modules for development for heat-treating the substrates in relation to development, and a third main transport mechanism for transferring the substrates to and from said developing modules and said heat-treating modules for development; and a fifth one of said controlled units is in form of an interface block including an interface's transport mechanism for transferring the substrates to and from an exposing apparatus provided separately from and externally of the substrate treating apparatus.

21. A substrate treating apparatus as defined in claim 20, further comprising a substrate inspecting controlled block including substrate inspecting modules for inspecting the substrates, and a main transport mechanism for substrate inspection for transferring the substrates to and from said substrate inspecting modules.

22. A substrate treating apparatus for performing a series of chemical treatments and heat treatments on substrates, comprising:

a plurality of treating blocks arranged in juxtaposition, each for performing a different chemical treatment;

each of said treating blocks including a chemical treating module for performing said different chemical treatment, a heat-treating module for performing heat treatment relating to said different chemical treatment, and a single main transport mechanism for transporting the substrates between said chemical treating modules and said heat-treating modules;

wherein said main transport mechanism of each treating block transfers the substrates to an adjacent one of the treating blocks through a substrate rest provided for receiving the substrates to be transferred; and wherein said substrate rest includes a sensor for detecting the substrates.

* * * * *